United States Patent
Toda

(10) Patent No.: US 9,111,611 B2
(45) Date of Patent: Aug. 18, 2015

(54) MEMORY SYSTEM

(71) Applicant: Kabushiki Kaisha Toshiba, Minato-ku (JP)

(72) Inventor: Haruki Toda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 38 days.

(21) Appl. No.: 14/078,677

(22) Filed: Nov. 13, 2013

(65) Prior Publication Data

US 2015/0063002 A1 Mar. 5, 2015

Related U.S. Application Data

(60) Provisional application No. 61/874,006, filed on Sep. 5, 2013.

(51) Int. Cl.
*G11C 11/00* (2006.01)
*G11C 13/00* (2006.01)

(52) U.S. Cl.
CPC ............ *G11C 13/003* (2013.01); *G11C 13/004* (2013.01); *G11C 13/0069* (2013.01)

(58) Field of Classification Search
CPC .............. H01L 27/249; H01L 29/7889; G11C 13/0002; G11C 13/0069; G11C 13/025; G11C 29/50008; G11C 2013/0083; G11C 29/70; G11C 29/832
USPC .......... 365/148, 191, 230.03, 189.16, 63, 100, 365/189.011, 72
See application file for complete search history.

(56) References Cited

U.S. PATENT DOCUMENTS

| 7,394,687 | B2 | 7/2008 | Bertin et al. |
|---|---|---|---|
| 7,989,789 | B2 | 8/2011 | Toda |
| 8,023,313 | B2 | 9/2011 | Toda |
| 8,309,407 | B2 | 11/2012 | Schricker |
| 2009/0166609 | A1 | 7/2009 | Schricker et al. |
| 2011/0127483 | A1 | 6/2011 | Sonehara |
| 2012/0012805 | A1 | 1/2012 | Yamamoto et al. |
| 2013/0208529 | A1* | 8/2013 | Tomotani et al. ............. 365/148 |

FOREIGN PATENT DOCUMENTS

| JP | 2010-55719 A | 3/2010 |
|---|---|---|
| JP | 2010-515240 A | 5/2010 |
| JP | 2011-508979 A | 3/2011 |
| JP | 4660095 B2 | 3/2011 |
| JP | 2011-119296 A | 6/2011 |

(Continued)

*Primary Examiner* — Thong Q Le
(74) *Attorney, Agent, or Firm* — Oblon, McClelland, Maier & Neustadt, L.L.P.

(57) ABSTRACT

A memory system according to the embodiment comprises a cell array including a unit cell array, the unit cell array containing plural first lines, plural second lines intersecting the plural first lines, and plural memory cells provided at the intersections of the plural first lines and the plural second lines and operative to store data in accordance with different resistance states; and an access circuit operative to execute a write sequence of changing the resistance state for writing data in the memory cell, wherein the access circuit, on the write sequence, executes a first step of changing all memory cells provided at the intersections of access first lines and the access and fault second lines to the high resistance state, and a second step of changing all or part of access cells connected to the access second line to the low resistance state.

20 Claims, 13 Drawing Sheets

(56) References Cited

FOREIGN PATENT DOCUMENTS

| JP | 2011-520249 A | 7/2011 |
| JP | 2012-23187 A | 2/2012 |
| JP | 2012-203936 A | 10/2012 |
| JP | 2013-200929 A | 10/2013 |
| JP | 2013-200930 A | 10/2013 |

* cited by examiner

MEMORY SYSTEM

CROSS-REFERENCE TO RELATED APPLICATIONS

This application is based upon and claims the benefit of priority from the prior U.S. Provisional Application 61/874,006, filed on Sep. 5, 2013, the entire contents of which are incorporated herein by reference.

BACKGROUND

1. Field

The embodiment of the present invention relates to a memory system.

2. Description of the Related Art

As memories capable of storing mass data for use, variable resistance memories including cell arrays easily formable in three dimensions, such as a ReRAM (Resistance RAM) and an ion memory, have received attention. These memories operate using the positive/negative of voltages in bipolar operation basically. They may also operate using one directional voltage in unipolar operation, though, as in a phase change memory and a carbon nanotube (CNT). A memory using nanotubes (NT) such as the CNT utilizes fine variations in molecules and accordingly causes lower power consumption than the use of phase changes caused when phase change elements pass though states such as material melting. Therefore, it becomes one of powerful candidates capable of configuring mass file memories.

A cell array can be formed in three dimensions by stacking unit cell arrays each including alignments of plural memory cells of the cross point type (hereinafter also referred to as "CP cells"). In the case of the cell array thus structured, however, the increase in capacity accordingly requires massive circuits for driving selection lines, which worsen the cell share as a problem.

In addition, parallel simultaneous accesses to plural CP cells commonly connected to one selection line put an overload on that selection line. This is a common problem in memory systems including cell arrays of CP cells, making no exception even if CNTs are used.

DETAILED DESCRIPTION

A memory system according to the embodiment comprises a cell array including a unit cell array, the unit cell array containing plural first lines, plural second lines intersecting the plural first lines, and plural memory cells provided at the intersections of the plural first lines and the plural second lines and operative to store data in accordance with different resistance states; and an access circuit operative to execute a write sequence of changing the resistance state for writing data in the memory cell, wherein the memory cell has two resistance states including a low resistance state and a high resistance state at least, an access-targeted memory cell is defined as an access cell, a first line connected to the access cell as an access first line, a second line connected to the access cell as an access second line, a fault-caused memory cell as a fault cell, and a second line connected to the fault cell as a fault second line, and the access circuit, on the write sequence, executes a first step of changing all memory cells provided at the intersections of access first lines and the access and fault second lines to the high resistance state, and a second step of changing all or part of access cells connected to the access second line to the low resistance state.

A memory system according to the embodiment is described below with reference to the drawings.

Figure 1:
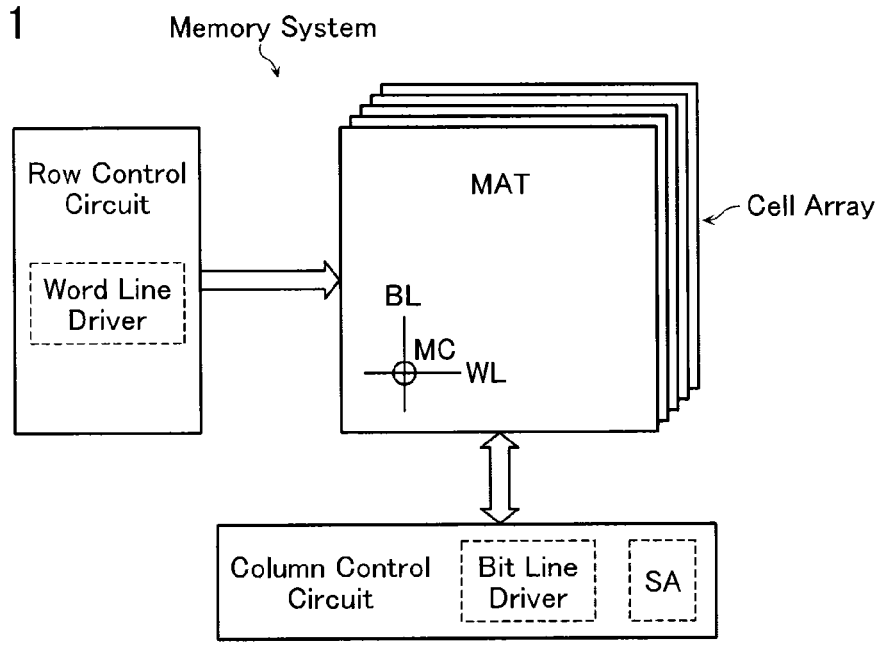
FIG. 1 is a diagram showing a configuration of a memory system according to the embodiment.

FIG. 1 is a diagram showing a configuration of the memory system according to the embodiment.

This memory system includes a cell array. The cell array includes plural unit cell arrays (hereinafter referred to as "MATs"). Each MAT has plural bit lines BL (first lines) and plural word lines WL (second lines), and plural memory cells MC that can be selected by plural bit lines BL and plural word lines WL.

The bit lines BL in the cell array are electrically connected to a column control circuit, which controls the bit lines BL to write data in the memory cell MC and read data out of the memory cell MC. The column control circuit includes a bit line driver operative to provide the bit line BL with potentials required for data write and data read, and a sense amp SA operative to sense and amplify the current flowing in the memory cell MC (hereinafter referred to as "cell current") at the time of data read to decide the data stored in the memory cell MC.

On the other hand, the word lines WL in the cell array are electrically connected to a row control circuit, which selects the word line WL at the time of writing data to the memory cell MC and reading data from the memory cell MC. The row control circuit includes a word line driver operative to provide the word line WL with potentials required for data write and data read. The row control circuit is contained in an access circuit together with the column control circuit.

Hereinafter, writing data to the memory cell MC may also be referred to as "write operation", and a series of processing for realizing the write operation as a "write sequence". Similarly, reading data from the memory cell MC may also be referred to as "read operation", and a series of processing for realizing the read operation as a "read sequence". The write and read operations may also be called by their generic term, that is, "access operation". In addition, bit lines BL and word lines WL may also be called by their generic term, that is, "selection lines". A memory cell MC targeted to access operation may also be referred to as an "access cell", and other memory cells MC as "non-access cells". Selection lines and so forth connected to the access cell may also be referred to as "access selection lines" and so forth, and other selection lines and so forth as "non-access selection lines" and so forth.

Next, the characteristics of the memory cell MC are described.

Hereinafter, a stack of carbon nanotubes (hereinafter referred to as "CNTs") is referred to as a "NT stack" (nanotube stack), and the NT stack provided with electrodes on both sides is referred to as a "NT stack cell". The NT stack cell integrated with the later-described access element turns to a memory cell MC. In addition, the memory cell MC in the embodiment is of the cross point type. In particular, if the cross point type is emphasized, it may also be referred to as a "CP cell". Further, the CNT has a nanoscale molecular structure excellent in electrical and physical characteristics and it is also applicable to the CP cell.

Figure 2:
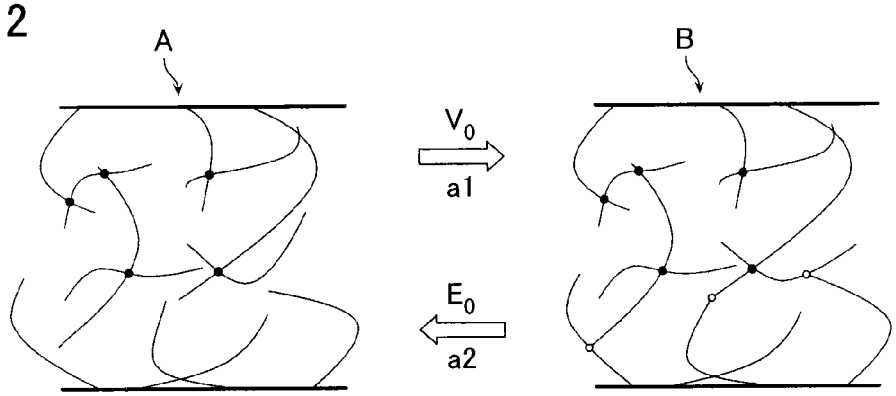
FIG. 2 is a diagram illustrative of variations in resistance state of a NT stack in the memory system according to the embodiment.
Figure 3:
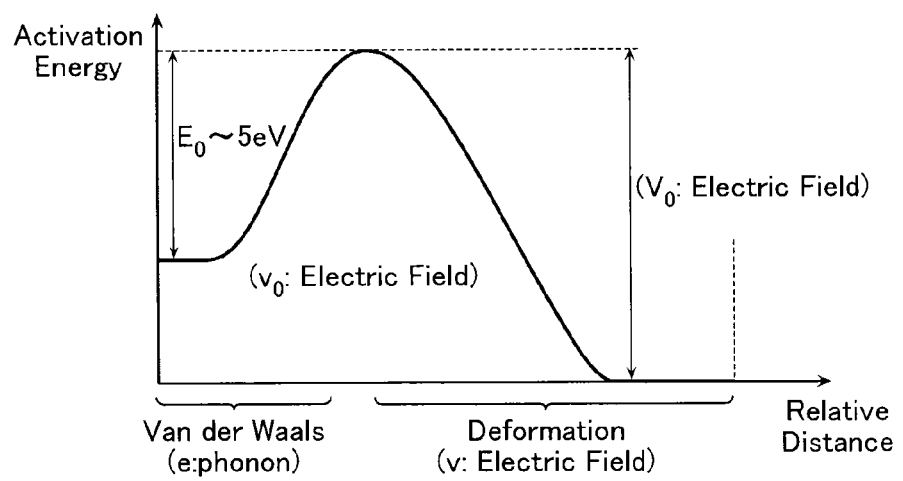
FIG. 3 shows the situation of activation energy of the NT stack in the memory system according to the embodiment.

FIG. 2 is a diagram illustrative of variations in resistance state of the NT stack in the memory system according to the embodiment. FIG. 3 is a graph showing the situation of activation energy of the NT stack in the memory system according to the embodiment. In FIG. 3 the lateral axis indicates relative distances between CNTs.

If the CNT is compared to a straw, the NT stack is like a bed containing straws stacked disorderly. It has a structure of straws partly contacted with and separated from each other. The NT stack can maintain the structure thereof by the contact force between CNTs based on the Van der Waals force and the stiffness held by the CNT.

When a NT stack is formed between electrodes to see the electric resistance of the NT stack, it indicates different values in accordance with the situation of contact between CNTs. This resistance appears in a similar order for NT stacks similarly formed. The resistance at this time becomes a resistance in a high resistance state of the NT stack. In this connection, there are many NT stacks having no contact between CNTs and this non-contact state is maintained by the stiffness held by CNT (see A of FIG. 2). When a voltage $V_0$ is applied between the electrodes, an electrostatic force of attraction acts between non-contact CNTs. If this overcomes the stiffness held by CNT, CNTs make contact with each other to lower the electrical resistance between the electrodes (the arrow a1 in FIG. 2). In FIG. 2, B shows a white circle indicative of a contact point between CNTs newly appeared in accordance with this operation.

Thereafter, even if application of the voltage $V_0$ across the electrodes is stopped, the contact state between CNTs can be maintained by the Van der Waals force (see B of FIG. 2). The resistance at this time becomes a resistance in a low resistance state of the NT stack.

When the NT stack in the low resistance state is returned to the high resistance state, it is required to inject phonons, that is, thermal oscillations into the NT stack. This means intensive oscillations of CNTs, which separate the contacted CNTs and return the shape of the CNT itself by the stiffness originally held by the CNT (the arrow a2 in FIG. 2). For this purpose, an electrical condition for allowing Joule heat of the NT stack to arise easily in the low resistance state is set between the electrodes to concentrate phonons on contact points between CNTs.

In this connection, as shown in FIG. 3, the potential $E_0$ of the Van der Waals force of the CNT is around 5 eV as is said. For overcoming the stiffness held by a CNT to bend the CNT and make it contact with another CNT, the electrodes require a voltage having a larger potential than the potential $E_0$ thereof to be applied therebetween.

The following description is given on the precondition that the high resistance state of the NT stack is assigned with data '0' and the low resistance state with data '1'. The embodiment herein described, however, is also applicable to the instance in which the low resistance state of the NT stack is assigned with data '0' and the high resistance state with data '1'.

As shown in FIG. 3, when an electrostatic force of attraction acts between CNTs, CNT molecules are bent. Then, when the distance between CNTs becomes a certain value or below, the Van der Waals force acts between CNTs. While the electrostatic force of attraction between CNTs is small, phonons are utilized to exceed the peak of the potential $E_0$ of the Van der Waals force.

Variations in resistance state of the NT stack are described next.

Figure 4:
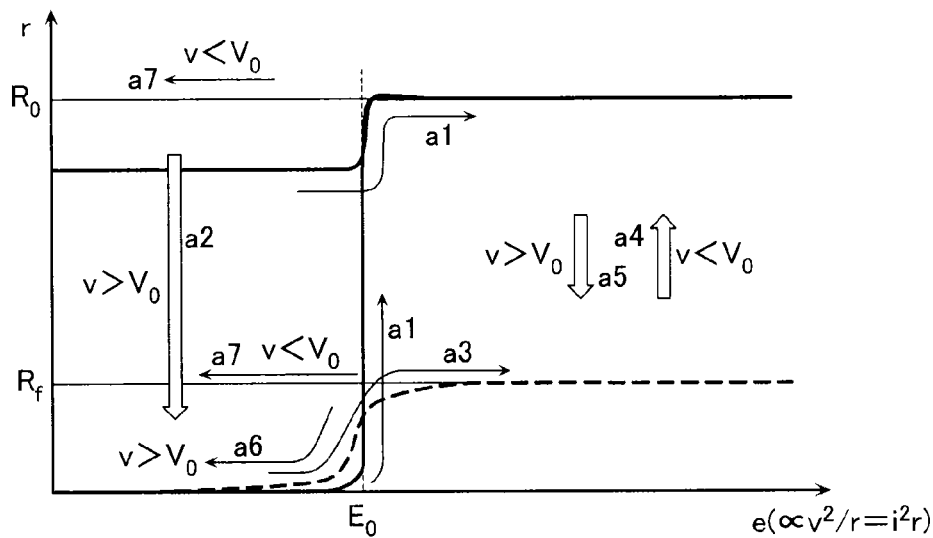
FIG. 4 is a graph showing relations among the phonon energy within the NT stack, the resistance of the NT stack, and the potential of the electric field within the NT stack in the memory system according to the embodiment.

FIG. 4 is a graph showing relations among the phonon energy within the NT stack, the resistance of the NT stack, and the potential of the electric field within the NT stack in the memory system according to the embodiment. The lateral axis in FIG. 4 indicates phonon average energy e that allows a CNT end to freely execute an oscillating motion. It is considered that the energy e is proportional to Joule heat caused by electric energy added to the NT stack. When the voltage between electrodes of the NT stack cell is defined as v, the current flowing in the NT stack as i, and the resistance of the NT stack as r, then the energy e is represented by $v^2/r$ or $i^2 r$. On the lateral axis, $e=E_0$ indicates the phonon energy corresponding to the Van der Waals force caused between CNTs. At this point, the contacted CNTs separate from each other, thereby increasing the resistance r of the NT stack. This variation is further affected by the situation of the electric field, that is, the voltage potential placed between CNTs. FIG. 4 shows the instance of $v<V_0$ with the solid line and the instance of $v>V_0$ with the dashed line because the graph varies the situation greatly in accordance with the voltage v. The voltage $V_0$ is an average voltage when the oscillating motion of a CNT end bends the CNT against the stiffness held by the CNT so as to make contact with another CNT. Namely, as shown by the arrow a1 in FIG. 4, in the case of $v<V_0$, the phonon energy e rises even if the NT stack has any resistance r and, when $e>E_0$ establishes, the contact between CNTs can be eliminated. As a result, the NT stack resistance rises up to $r=R_0$. In addition, as shown by the arrow a2 in FIG. 4, even if the NT stack has any resistance r in the case of $v>V_0$, it is bent until the CNT end makes contact with another adjacent CNT when e is small. As a result, the NT stack resistance r falls down to the minimum value. Then, this NT stack resistance r is fixed by the Van der Waals force. When the phonon energy e is elevated, the oscillating motion eliminates the contact between CNTs. Then, when $e>E_0$ establishes, almost all contacts between CNTs can be eliminated. As a result, the NT stack resistance r becomes higher as shown by the arrow a3 in FIG. 4. As the bias of the electric field is large, however, the probability of contacts newly made between CNTs is also large. As a result, the NT stack resistance r has a value of around $R_f$ larger than the minimum value. In a state of high phonon energy e, the magnitude relation between the voltage v and the voltage $V_0$ makes the NT stack resistance r come and go between $R_f$ and $R_0$ as shown by the arrows a4 and a5 in FIG. 4. On the other hand, in a state of low phonon energy e, the NT stack makes only a change to a low resistance and no change to a high resistance in the case of $v>V_0$ as shown by the arrow a6 in FIG. 4.

In the state of high phonon energy e, even if $e \leq E_0$ establishes in the case of $v<V_0$, the NT stack maintains the same resistance r as that in the case of $e>E_0$ as shown by the arrow a7 in FIG. 4.

Next, in consideration of the above-described variations in the NT stack resistance r, a method of changing the NT stack resistance r is described.

Initially, a description is given to raising the NT stack resistance.

Figure 5:
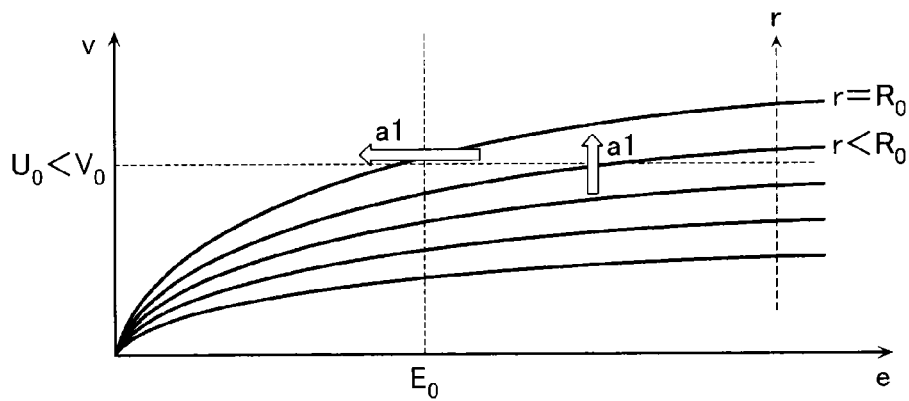
FIG. 5 is a graph showing a relation between the phonon energy and the voltage across electrodes of the NT stack when the NT stack resistance is made higher in the memory system according to the embodiment.

FIG. 5 is a graph showing a relation between the phonon energy and the voltage across electrodes of the NT stack cell when the NT stack resistance is made higher in the memory system according to the embodiment. FIG. 5 shows $V^2/r$ relative to the phonon energy e at every resistance.

In the case of $v<V_0$, the NT stack resistance becomes $r=R_0$ in a state of high energy e. When the energy e lowers, the NT stack resistance is maintained almost at $r=R0$. This is utilized to make the NT stack resistance higher.

With respect to the maximum NT stack resistance $r=R_0$, the voltage v is made sufficiently smaller than the voltage $V_0$ so that $v^2/r$ becomes around $E_0$ or below. In addition, with respect to the minimum NT stack resistance r, it becomes 10 or more times larger than $E_0$. For that purpose, the voltage between electrodes of the NT stack cell is set to $v=U_0$. In this case, until the NT stack resistance r becomes 10 times the minimum resistance at least, the phonon energy keeps $e>E_0$.

Thereafter, the voltage v between the electrodes of the NT stack cell is gradually made larger so as to prevent the current i from increasing and make the voltage stay back from the voltage $V_0$. Further, even if the resistance r is high, the energy e can be controlled to exceed $E_0$. In this case, the NT stack resistance r can be made higher while the current i is maintained small. This corresponds to the instance in which the higher the resistance r, the larger the voltage v becomes in the case of constant energy e in FIG. 5. In this case, the state varies as the arrow a1 in FIG. 5.

In this connection, in read operation, the voltage v applied between the electrodes of the NT stack cell is made equal to or lower than the voltage $U_0/3$ to achieve 1/10 or below the energy required for making a transition to the high resistance state. This is required to prevent the NT stack resistance from rising. Therefore, in read operation, the current sense is desirable because it can expect a larger current in a lower resistance compared to the voltage sense.

Subsequently, a description is given to lowering the NT stack resistance.

Figure 6:
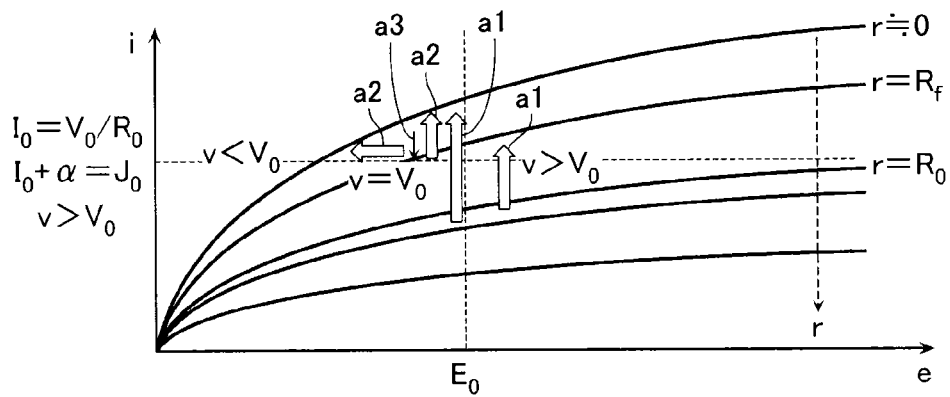
FIG. 6 is a graph showing a relation between the phonon energy and the cell current in the NT stack when the NT stack resistance is made lower in the memory system according to the embodiment.

FIG. 6 is a graph showing a relation between the phonon energy and the cell current in the NT stack when the NT stack resistance is made lower in the memory system according to the embodiment. FIG. 6 shows $i^2 r$ relative to the phonon energy e at every resistance.

The NT stack resistance can be made lower by utilizing the fact that the NT stack resistance r lowers one-sidedly if the voltage applied between the electrodes of the NT stack cell satisfies $v>V_0$ and, in particular, by utilizing the fact that the NT stack resistance r becomes lowermost if the energy satisfies $e \leq E0$. When a voltage $v=V_0$ is applied between the electrodes of the NT stack cell having the maximum resistance $r=R_0$, a current $i=I_0$ flows. A constant voltage $v>V_0$ is applied across the NT stack by limiting the current to a current $i=J_0$ ($>I_0$). At this time, in the case of $J_0^2 R_0 < E_0$, as the voltage $v>V_0$ is applied between the electrodes of the NT stack cell, the NT stack resistance r lowers. In addition, as the current is limited by $i \leq J_0$, the voltage v sharply falls and the NT stack stabilizes at a low resistance. In addition, in the case of $J_0^2 R_0 < E_0$, the NT stack resistance lowers to $r=R_f$. At this time, if $J_0^2 R_f < E_0$ and $J_0 R_f > V_0$, then the phonon energy e is small and accordingly the resistance r lowers further. In other cases, the cell resistance stops at $r=R_f$ and does not become lowermost. In any case, the resistance can be made lower.

These variations in the resistance correspond to the arrows a1 and a2 in FIG. 6. If lowering the resistance stays at the resistance $r=R_f$, the arrow a3 in FIG. 6 indicative of the voltage $v=V_0$ locates rightward from the dotted line in FIG. 6 indicative of the energy $E_0$. This case corresponds to the case where it cannot be changed from the curve indicative of the resistance $r=R_f$.

When the NT stack resistance is made lower, in practice, it is not required to always maintain a constant current. It is sufficient to satisfy the condition about the voltage $v>V_0$ and $iV_0<E_0$. Therefore, it is not required to thoughtlessly elevate the voltage v applied to the high-resistance NT stack for maintaining the constant current. If the lowered resistance increases the current i, the voltage v applied across the NT stack lowers.

The following description is given to a memory cell MC using the NT stack.

Figure 7:
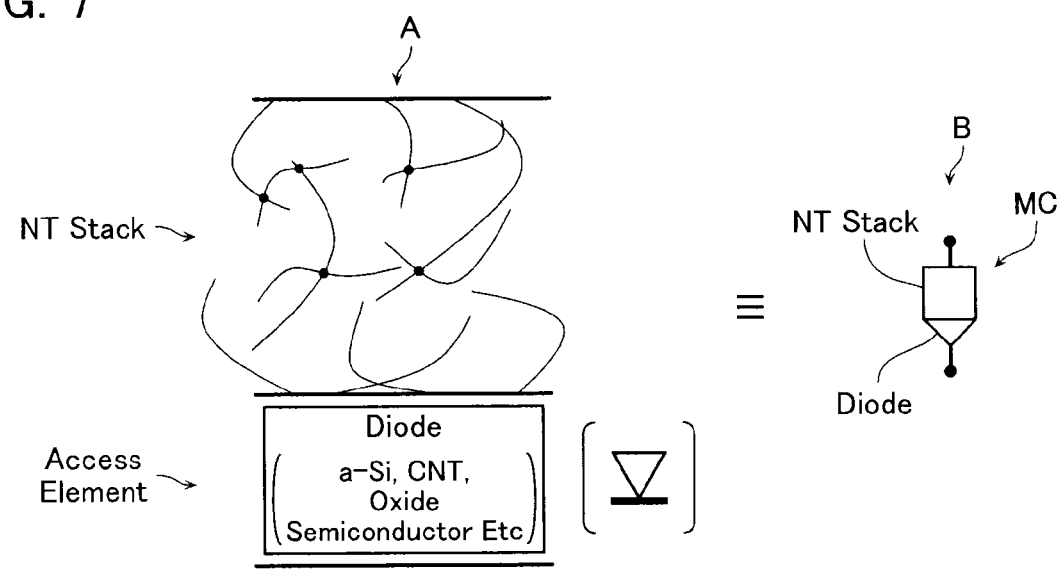
FIG. 7 is a diagram showing a structure and symbol of a memory cell in the memory system according to the embodiment.
Figure 8:
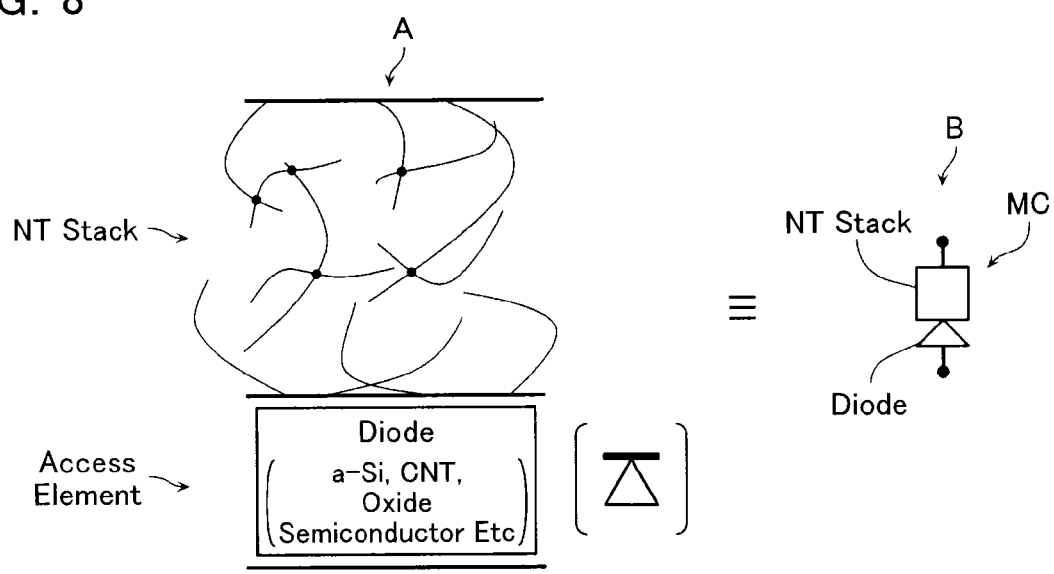
FIG. 8 is a diagram showing a structure and symbol of a memory cell in the memory system according to the embodiment.

FIGS. 7 and 8 are diagrams showing a structure and symbol of a memory cell in the memory system according to the embodiment. A in the figure shows a structure of the memory cell and B in the figure shows a symbol of the memory cell corresponding to the structure.

The memory cell MC has an integrated structure of a NT stack and an access element, that is, a non-ohmic element as shown in A of FIGS. 7 and 8. Hereinafter, a memory cell MC using a diode as the non-ohmic element is described by way of example. The material of the diode may include amorphous silicon (a-Si), CNT, oxide semiconductors and so forth suitable for process integration. The memory cell MC includes an electrode, a NT stack, a diode and an electrode in this order from one line to the other line. As needed, an electrode may also be provided between the NT stack and the diode. The direction of the diode may be determined suitable for the process. In a word, as shown in A of FIG. 7, the NT stack-located side may be determined as the anode. As shown in A of FIG. 8, the NT stack-located side may be determined as the cathode. The following description is given using the memory cell MC having the structure of FIG. 7.

The cell array may be configured by combining the memory cell MC having the structure of FIG. 7 and the memory cell MC having the structure of FIG. 8. In this case, only doping orders and doping elements may be changed for process integration in the process of building diodes so that it is made possible to easily construct a three-dimensionally structured cell array sharing a selection line between vertically adjacent MATs.

The following description is given to write operation executed to a memory cell MC. The write operation herein described is such write operation that assigns different resistance states of a NT stack cell to values of data. The write operation according to the embodiment also considers the presence of a reverse-breakdown-voltage or short fault memory cell MC (hereinafter also referred as a "fault cell") on a MAT. Even in the presence of a fault cell, no influence is exerted on other memory cells MC and a large current addition is not put on only one word line WL selected on the MAT. A write sequence according to the embodiment, on writing data '1', executes the step of writing data '1' via the step of writing data '0'. Therefore, it may also be referred to as a "write sequence of the 2-step type".

The write sequence according to the embodiment includes an initial step (third step), an all '0' write step (first step), a '1' write step (second step) and a final/standby step, that is, four steps (fourth step).

Initially, the initial step in the write sequence is described.

Figure 9:
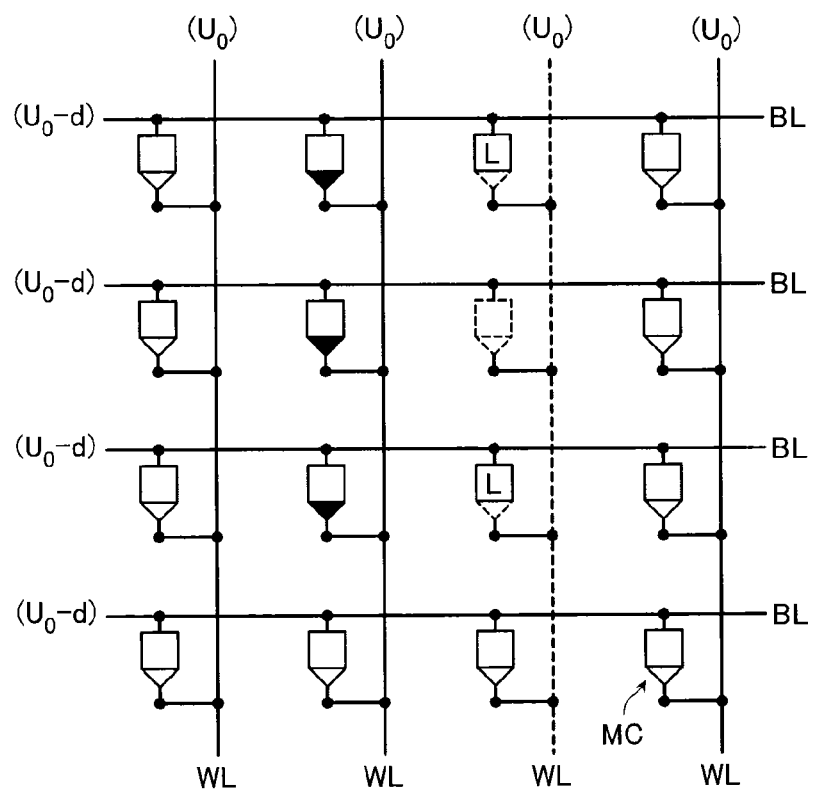
FIG. 9 is a diagram showing a bias state of a cell array at the initial step in a write sequence in the memory system according to the embodiment.

FIG. 9 is a diagram showing a bias state of a cell array at the initial step in the write sequence in the memory system according to the embodiment.

A selection line and so forth connected to a fault cell may also be referred to as a "fault selection line" and so forth.

In FIG. 9, a memory cell MC including an 'L'-added NT stack part shows a memory cell in the low resistance state, a memory cell MC including an 'H'-added NT stack part shows a memory cell in the high resistance state, a memory cell MC including a black-colored diode part shows an access cell, a memory cell MC including a dashed-lined NT stack part shows a memory cell having a fault in the NT stack part, a memory cell MC including a dashed-lined diode part shows a memory cell having a fault in the diode, and a dashed-lined word line WL shows a word line WL connected to a fault cell. These expressions are similarly applied in FIGS. 10-12.

The initial step is a step executed at the start in the write sequence. At the initial step, all memory cells MC are reverse-biased small. Namely, all bit lines BL are provided with the potential $U_0$-d and all word lines WL with the potential $U_0$. Then, when a current flowing in a word line WL is larger than that assumed from the reverse bias, the word line is specified. In this case, d denotes a small appropriate quantity, and $U_0$-d means a far lower potential than $U_0$. In the case shown in FIGS. 9-12, three memory cells MC connected to one word line WL are simultaneously accessed. Selection lines connected to these three memory cells MC are connected to fault cells in this case.

Subsequently, the all '0' write step in the write sequence is described.

Figure 10:
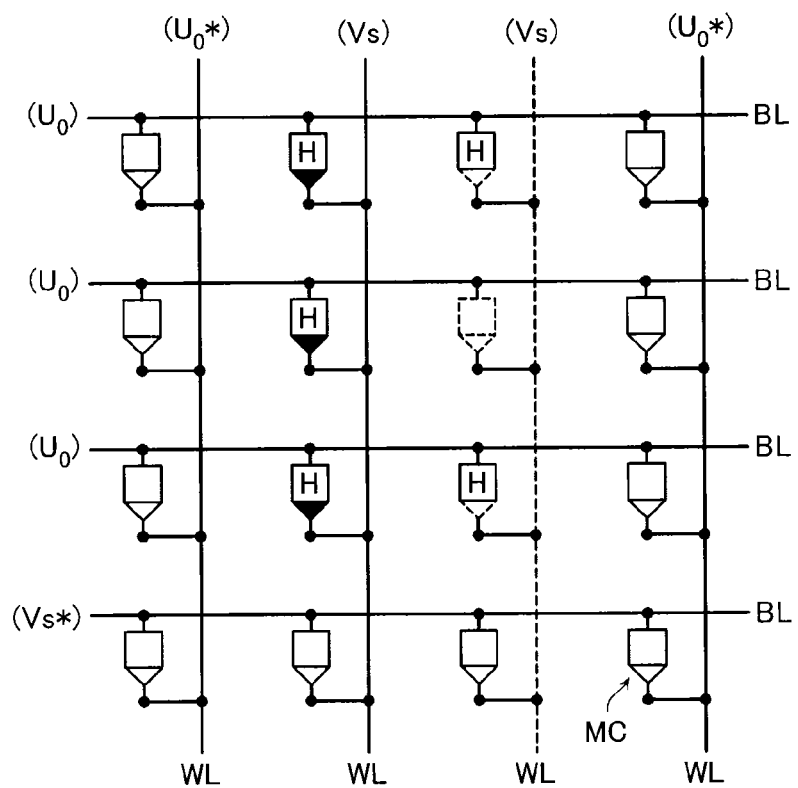
FIG. 10 is a diagram showing a bias state of a cell array at the all '0' write step in the write sequence in the memory system according to the embodiment.

FIG. 10 is a diagram showing a bias state of a cell array at the all '0' write step in the write sequence in the memory system according to the embodiment.

The all '0' write step is a step following the initial step and is a step of changing the access cell MC to the high resistance state. At the all '0' write step, the voltage applied across the memory cell MC is relatively small, and the current flowing in the selection line becomes smaller as the access cell MC turns to the high resistance state. Therefore, it is possible to execute simultaneous '0' write to all access cells MC.

At the all '0' write step, for the purpose of arranging the initial states of the access cells MC subjected to transitions to the low resistance state at the subsequently executed '1' write step, all memory cells MC are changed to the high resistance state corresponding to '0'. Namely, all access bit lines BL are provided with the potential $U_0$ (first potential), and all word lines WL with the potential Vs (second potential) lower than the potential $U_0$. As a matter of course, the fault word line WL detected at the initial step is handled special and the fault word line WL is provided with the potential Vs. Thus, at the following steps, the fault word line WL is precluded from access targets.

In addition, non-access selection lines are brought into the floating state isolated from the power supply. At this time, the potential on the access selection line turns in via non-access cells MC such that the potential Vs on non-access bit lines BL becomes the floating state potential Vs* and the potential $U_0$ on non-access word lines WL becomes the floating state potential $U_0$*. In this connection, "*" added to the potential represents that the floating state is reached at that potential.

At the all '0' write step, the access cell MC and non-access cells MC between the access bit line BL and the fault word line WL are put in such a bias state that makes transitions to the high resistance state. In this case, current flows in a fault cell of the above cells. When the access word line WL is connected to a fault cell, which includes a nice diode part and a NT stack having a fault that prevents the resistance from rising, the same current flows therein as that in the fault word line WL. Therefore, at the following steps, this access word line WL is also precluded from access targets.

At the all '0' write step, all access cells MC are brought into the high resistance state so that memory cells MC connected to the fault word line WL increasingly contain those having the raised resistance in order.

At the all '0' write step, current continuously flows in the fault cell but the value thereof is small because the potential $U_0$ is relatively small. In addition, the current flowing in the fault cell flows only in the fault word line WL and accordingly almost no disturbance exerts any influence on memory cells MC connected to the access word line WL. Depending on the state of the fault, however, operating current at the all '0' write step may increase.

Subsequently, the '1' write step in the write sequence is described.

Figure 11:
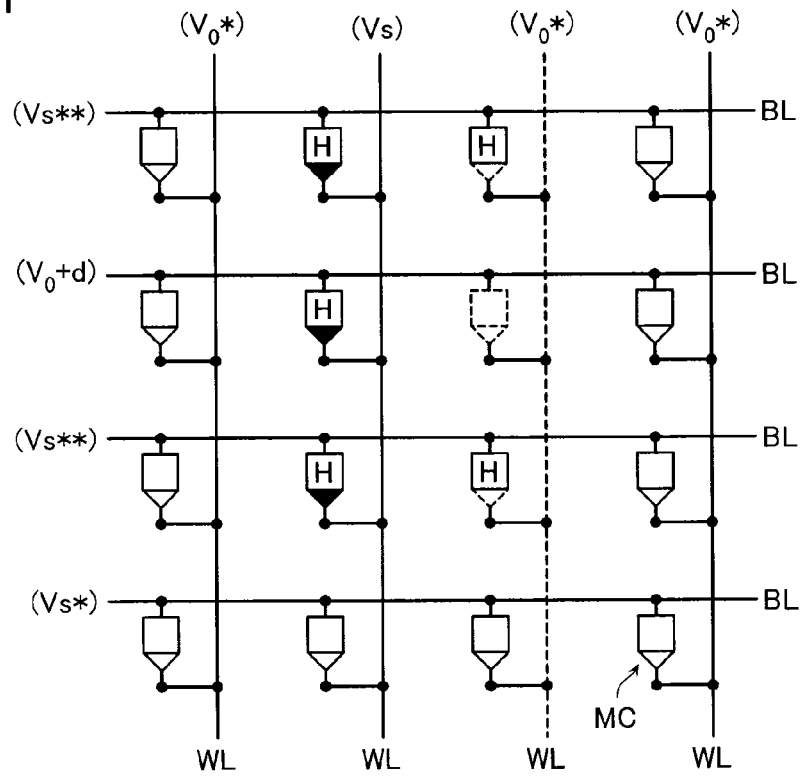
FIG. 11 is a diagram showing a bias state of a cell array at the '1' write step in the write sequence in the memory system according to the embodiment.

FIG. 11 is a diagram showing a bias state of a cell array at the '1' write step in the write sequence in the memory system according to the embodiment.

The '1' write step is a step executed following the all '0' write step and is a step of changing the access cell MC to the low resistance state. Only the access bit line BL connected to the access cell MC subjected to '1' write is provided with the potential $V_0+d$ to change the access cell MC subjected to '1' write to the low resistance state. In this case, d denotes a small appropriate quantity, and $V_0+d$ means a far higher potential than $V_0$. Plural access cells MC can be simultaneously subjected to '1' write. In this case, because these access cells MC are originally changed to the high resistance state at the all '0' write step, no large cell current flows therein in the initial stage. Therefore, no large disturbance extends to other memory cells MC.

At the '1' write step, all access bit lines BL other than the access bit line BL connected to the access cell MC subjected to '1' write are brought into the floating state. In addition, only the access word line WL is provided with the potential Vs and other word lines WL are brought into the floating state.

In the case shown in FIG. 11, the resistance of the access cell MC sharing the bit line BL with the fault cell is made lower. In this case, as the fault word line WL is kept in the floating state, no large influence exerts on the access cell MC.

The bit lines BL in the floating state almost all have the potential $Vs^*$. In this case, the bit line BL connected to a fault cell having a fault in the diode part is not affected by the reverse breakdown voltage of the fault cell and accordingly it has a floating state potential $Vs^{**}$ shifted higher by the extent. The word lines WL in the floating state almost all have the potential $V_0^*$. The potentials $Vs^*$ and $Vs^{**}$ are higher potentials than the potential Vs but are not fixedly determined potentials. In addition, the potential $V_0^*$ is a lower potential than the potential $V_0$ but is not a fixedly determined potential.

Thus, only the access cell MC subjected to '1' write is applied with a higher voltage than the voltage $V_0$. Therefore, the access cell MC in the high resistance state changes to the low resistance state to write '1' therein.

Finally, the final/standby step in the write sequence is described.

Figure 12:
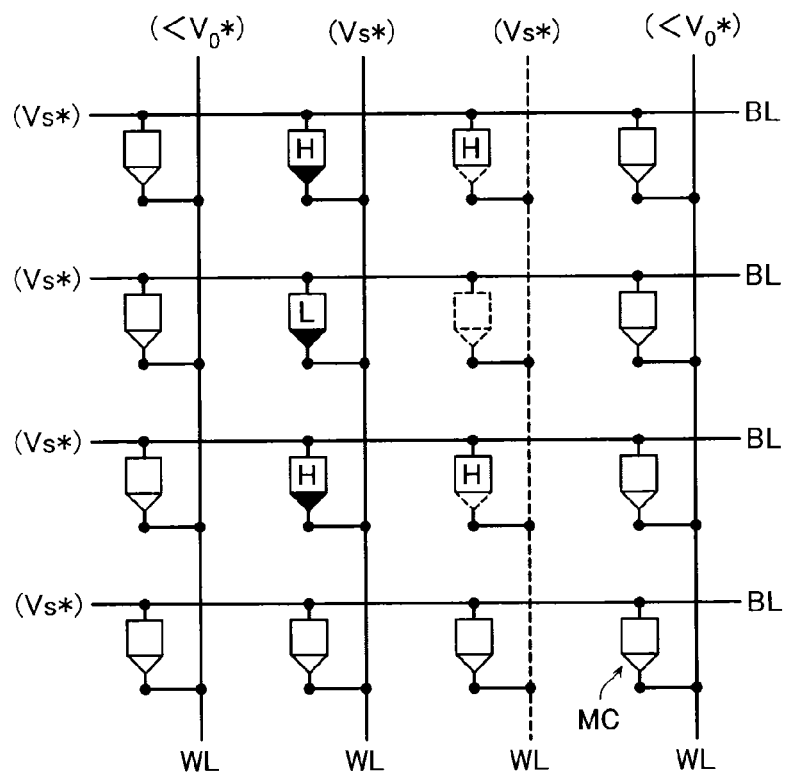
FIG. 12 is a diagram showing a bias state of a cell array at the final/standby step in the write sequence in the memory system according to the embodiment.

FIG. 12 is a diagram showing a bias state of a cell array at the final/standby step in the write sequence in the memory system according to the embodiment.

The final/standby step is the last step in the write sequence. At the final/standby step, all selection lines are brought into the floating state. The potential at this time can be determined by the distribution and history of the resistance states of memory cells MC. Accordingly, it is not fixedly determined but it does not change the resistance state of the memory cell MC. FIG. 12 shows potentials assumed from the bias state of the cell array at the '1' write step shown in FIG. 11.

The node having the potential $V_0^*$ is discharged after a while and becomes a further lower potential.

In the above-described write sequence, as only one word line WL is determined as an access word line WL relative to plural access bit lines BL, the word line WL suffers a heavy load. Whether the tolerance of the load on this access word line WL, that is, the length of the word line WL is appropriate or not for the potential drop is one of the conditions for determining the scale of the MAT. If plural fault cells are connected to the same word line WL, disturbances such as current turns may interfere with writing data to the access cell MC. Then, the following description is given to the point that allows the write sequence according to the embodiment to solve these anxieties.

Initially, the initial step in the write sequence is described.

Figure 13:
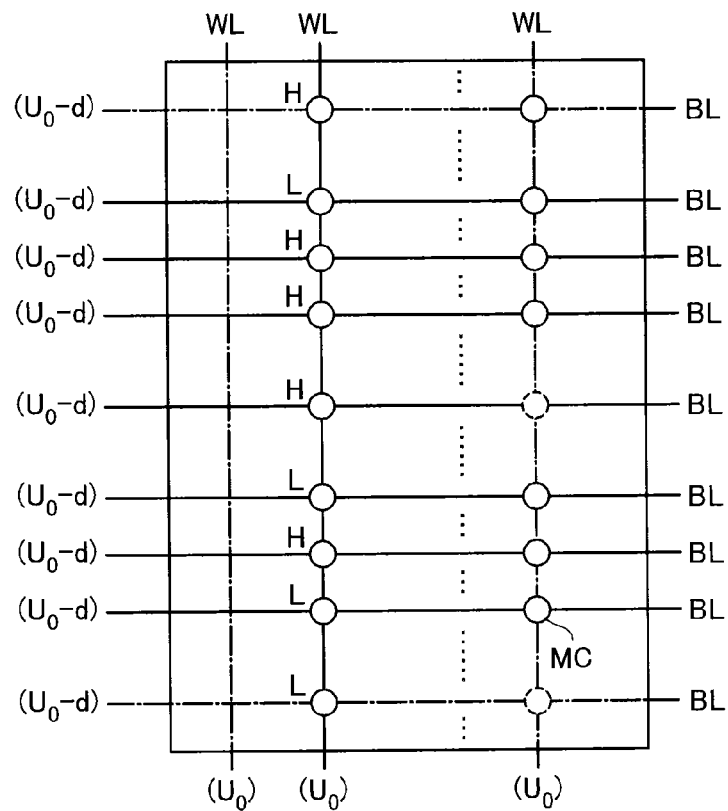
FIG. 13 is a diagram showing a bias state of a cell array at the initial step in the write sequence in the memory system according to the embodiment.

FIG. 13 is a diagram showing a bias state of a cell array at the initial step in the write sequence in the memory system according to the embodiment. In FIG. 13, a dashed-circled memory cell MC shows a fault cell, an 'L'-added memory cell MC shows a memory cell in the low resistance state, and an 'H'-added memory cell MC shows a memory cell in the high resistance state. In addition, a chain-lined selection line shows a non-access selection line, and a dashed-lined word line WL shows a fault word line. These expressions are similarly applied in FIGS. 14 and 15.

At the initial step, all bit lines BL are provided with the potential $U_0-d$ and all word lines WL with the potential $U_0$. In this case, a current larger than that assumed in the case of the reverse-biased normal memory cell MC is detected in a selection line connected to the fault cell, thereby specifying the fault selection line. The specified fault word line WL is handled as a word line WL provided with the same fixed potential Vs as that on the access word line WL at the subsequent all '0' write step.

Subsequently, the all '0' write step in the write sequence is described.

Figure 14:
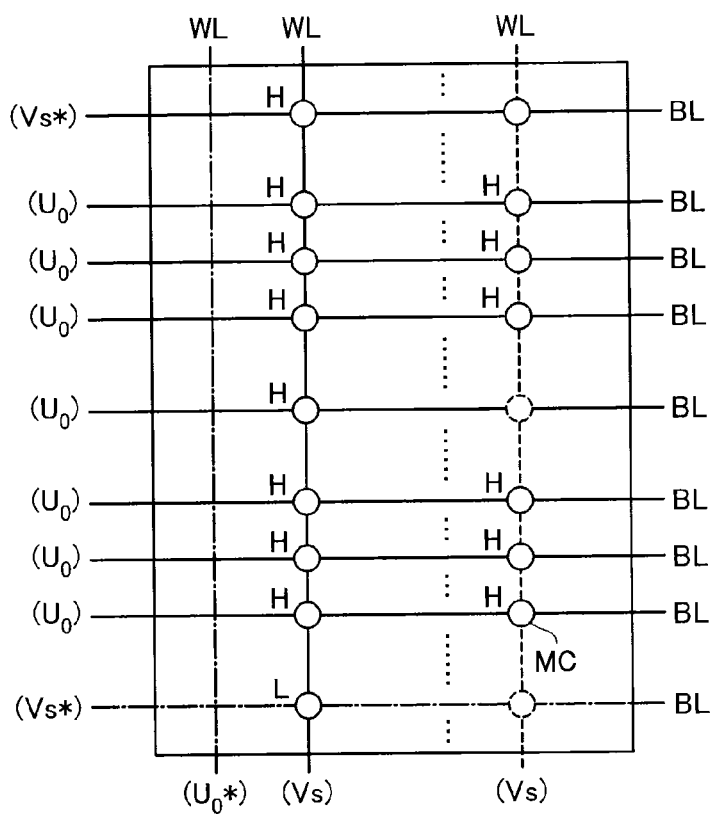
FIG. 14 is a diagram showing a bias state of a cell array at the all '0' write step in the write sequence in the memory system according to the embodiment.

FIG. 14 is a diagram showing a bias state of a cell array at the all '0' write step in the write sequence in the memory system according to the embodiment.

At the all '0' write step, the fault word line WL is provided with the potential Vs while non-access bit lines BL are brought into the floating state and non-access word lines WL other than the fault word line WL are also brought into the floating state.

On the other hand, all access bit lines BL subjected to simultaneous access are provided with the potential $U_0$. When a low voltage $U_0$ is steadily applied across memory cells MC, phonons are injected into memory cells MC in the low resistance state as described above. Thus, the corresponding memory cells MC are changed to the high resistance state by the access word line WL and the fault word line WL. At this time, even in the presence of many memory cells MC in the low resistance state, the potential $U_0$ is low and the cell current becomes smaller after the memory cells MC change to the high resistance state. Therefore, the electric load on the word line WL provided with the potential Vs is light. To that extent, it is possible to increase the number of access bit lines BL subjected to simultaneous access. In addition, among the memory cells MC connected to the fault word line WL, memory cells MC, except a fault cell having faults in a NT stack and a diode and a fault cell including a NT stack having a raising-unable resistance, are made to have a higher resistance in order at every access. Accordingly, the current flowing through these memory cells MC can be reduced in order.

As a result, at the subsequent '1' write step, a high voltage via the fault cell is not applied to non-access cells MC via memory cells MC in the low resistance state. Therefore, the influence of disturbances to normal memory cells MC can be reduced sharply.

At the all '0' write step, the current flowing in the access word line WL cannot be made smaller such that all access cells MC may not change to the high resistance state. In such the case, this access word line WL is regarded as connected to a fault cell including a nice diode and a NT stack having a fault. Then, this access word line WL is not accessed and the all '0' write step is suspended. In addition, this access word line WL is precluded from access targets at the following steps.

Subsequently, the '1' write step in the write sequence is described.

Figure 15:
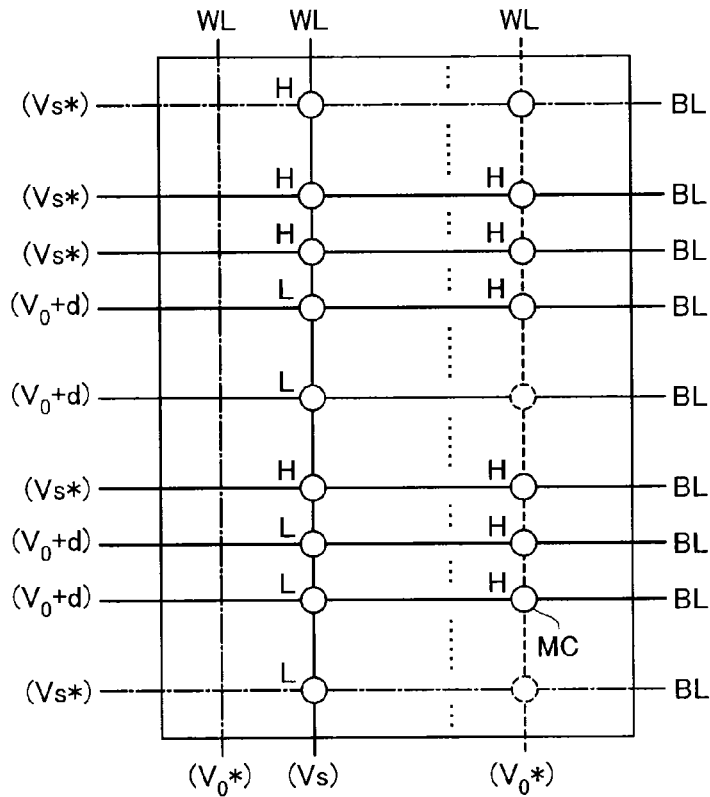
FIG. 15 is a diagram showing a bias state of a cell array at the '1' write step in the write sequence in the memory system according to the embodiment.

FIG. 15 is a diagram showing a bias state of a cell array at the '1' write step in the write sequence in the memory system according to the embodiment.

At the '1' write step, the access cell MC subjected to '1' write is provided with the voltage $V_0+d$ and all other non-access cells MC are brought into the floating state. In addition, only the access word line WL is provided with the potential Vs and other selection lines are brought into the floating state. As a result, memory cells MC having electrodes provided with a voltage equal to or higher than the voltage $V_0$ therebetween include only access cells MC. Accordingly, only access cells MC change to the low resistance state.

When bit lines BL are provided with the potential $V_0+d$ in the initial stage, the access cell MC is in the high resistance state. Therefore, no large current flows and the word line WL suffers no load. As the access cell MC begins to change to the low resistance state, current begins to flow in the access cell MC. In this case, individual bit lines BL are under high impedance control at the later-described circuit to limit current. Accordingly, the load on the word line WL does not increase extremely.

The following description is given to potential variations on selection lines at the time of the write sequence.

Figure 16:
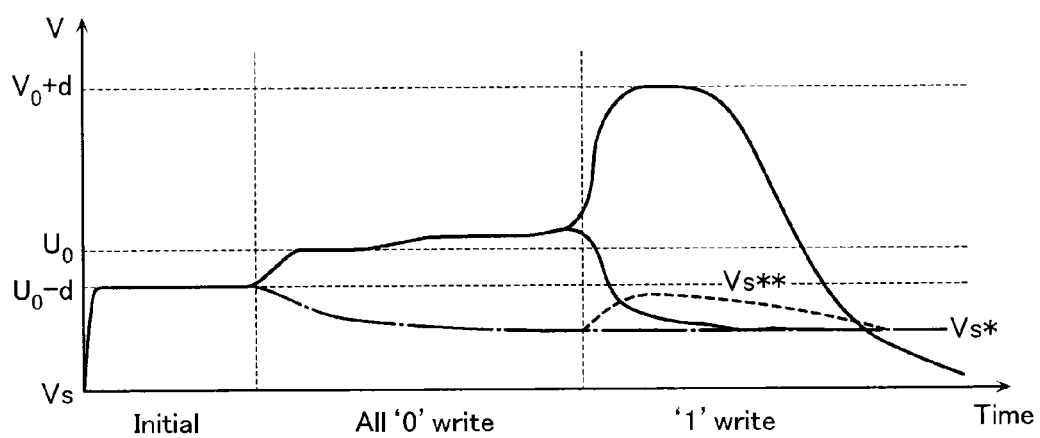
FIG. 16 is a diagram showing potential variations on bit lines at the time of the write sequence in the memory system according to the embodiment.
Figure 17:
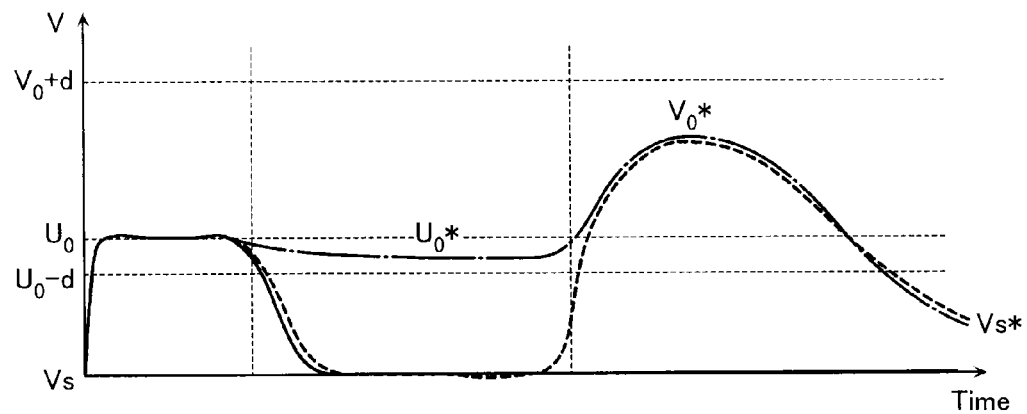
FIG. 17 is a diagram showing potential variations on word lines at the time of the write sequence in the memory system according to the embodiment.

FIGS. 16 and 17 are diagrams showing potential variations on selection lines at the time of the write sequence in the memory system according to the embodiment. FIG. 16 shows those on the bit line BL and FIG. 17 those on the word line WL. In FIGS. 16 and 17, a chain line indicates a non-access selection line, and a dashed line indicates a non-access bit line BL connected to a fault word line WL and a fault cell. In addition, the time along the lateral axis is indicated dividedly among the initial step, the all '0' write step and the '1' write step. It is not required that these three steps are successive. Rather, it is sufficient if the order of the steps is kept at the time of access to memory cells MC. For example, a break period such as a standby step may locate between the steps.

Initially, at the initial step, all bit lines BL in the MAT are provided with the potential $U_0-d$ and all word lines WL with the potential $U_0$. At this step, a fault word line WL can be specified.

Subsequently, at the all '0' write step, the access word line WL and the fault word line WL are both provided with the potential Vs. The access bit line BL is provided with the potential $U_0$ and raised up little by little from the potential $U_0$ as the resistance of the access cell MC is made higher. FIG. 16 shows the situation when the potential on the access bit line BL is pulled up in two stages. Potential variations on the access bit line BL may arise successively or in more than two stages. Non-access bit lines BL are brought into the floating state and accordingly vary little by little to the potential Vs*.

Non-access word lines WL are also brought into the floating state and accordingly become the potential $U_0^*$.

Subsequently, at the '1' write step, the access bit lines BL include an access bit line BL connected to the access cell MC subjected to '1' write, which is provided with the potential $V_0+d$. Thereafter, the impedance of the power supply is made higher so as to lower the potential on those access bit lines BL in accordance with the increase in cell current. Other access bit lines BL are brought into the floating state and accordingly vary to the potential Vs* in accordance with a lapse of time. The bit line BL in the floating state connected to the fault cell varies to the potential Vs** as the access bit line BL is provided with the potential $V_0+d$ as described above. The access word line WL remains at the setting of the potential Vs. All non-access word lines WL containing the fault word line WL are brought into the floating state and accordingly vary to the potential $U_0^*$. They further vary to the potential Vs* in accordance with the reduction in potential on the access bit line BL.

When the potential differences between these bit lines BL and word lines WL are seen, a voltage capable of causing a state transition is applied only across the access cell MC as can be found.

In the write sequence according to the embodiment, the potential is set on the access bit line BL to control the state of the NT stack. For this purpose, the impedance control over a potential setting unit in an access circuit is important. Then, the following description is given to impedance switching write buffers operative to execute the impedance control.

Figure 18:
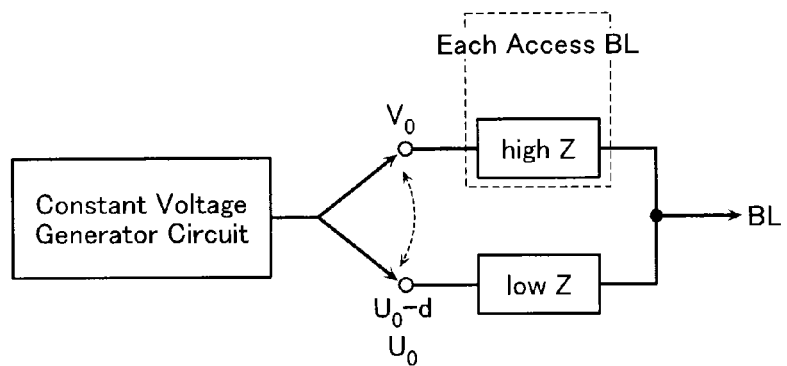
FIG. 18 is a circuit diagram of an impedance switching write buffer in the memory system according to the embodiment.
Figure 19:
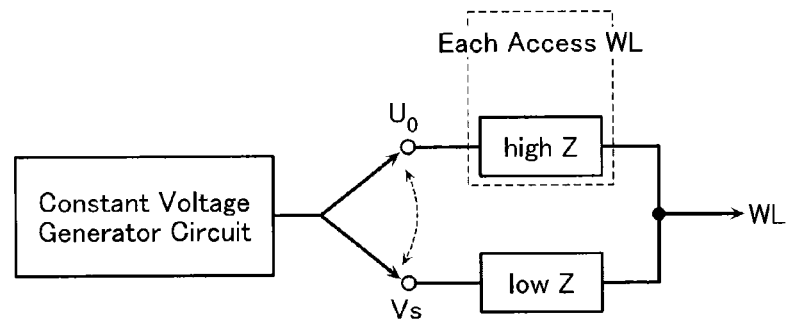
FIG. 19 is a circuit diagram of an impedance switching write buffer in the memory system according to the embodiment.

FIGS. 18 and 19 are circuit diagrams of the impedance switching write buffers in the memory system according to the embodiment. FIG. 18 shows a circuit provided for the bit line BL and FIG. 19 shows a circuit provided for the word line WL.

The impedance switching write buffer is a circuit operative to control the impedance between a selection line and a constant voltage generator circuit operative to generate voltages required for write operation. It controls such that the access cell MC makes a transition to a desired resistance state.

Initially, a description is given to the impedance switching write buffer for the bit line BL requiring the impedance control in the write sequence. This buffer inserts, in accordance with the step in the write sequence, either of a high impedance element, that is, a high Z circuit block and a low impedance element, that is, a low Z circuit block into the bit line BL as shown in FIG. 18. The insertion of the low Z circuit block, however, also contains the case of no positive insertion of any impedance element.

At the initial step, all memory cells MC in the MAT are reverse-biased to monitor leakage current. If the leakage current is large, the voltage drop caused across the impedance element is used to compare the amount of fine current thereof. In addition, so as to prevent a total amount of the leakage current from increasing, the high impedance element, that is, the high Z circuit block can be used to provide each word line WL with the potential $U_0-d$ therethrough. As specification of a fault is only required for the word line WL, the low Z circuit block is inserted into the bit line BL to facilitate detection of the fault word line WL.

At the all '0' write step, the memory cell MC is changed to the high resistance state. Accordingly, in the initial stage, it is required to provide the bit line BL with a low potential $U_0$ to allow a certain amount of current to flow in the bit line BL. Therefore, the low Z circuit block is inserted to gain current so as to reduce the current in an aligned manner as the resistance of the memory cell MC is made higher.

At the '1' write step, the access cell MC is changed to the low resistance state through the access bit line BL. Accordingly, the access bit line BL is provided with a high potential $V_0$. At this time, the access cell MC is in the high resistance state and accordingly current hardly flows in the access cell MC. Therefore, the access bit line BL is provided with a potential via the high Z circuit block. Thus, when the resistance of the access cell MC lowers, the potential on the bit line BL reduces in an aligned manner to suppress the current.

Insertion of the high Z circuit block is executed at every bit line BL. Accordingly, the high Z circuit block is contained in a decoder for the bit line BL.

Figure 20:
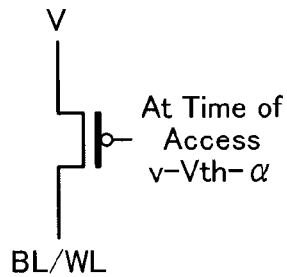
FIG. 20 provides an example of a circuit diagram of a high Z circuit block in the impedance switching write buffer in the memory system according to the embodiment.

FIG. 20 provides an example of a circuit diagram of the high Z circuit block in the impedance switching write buffer in the memory system according to the embodiment. The circuit shown in this example utilizes the saturation characteristic of a P channel transistor. A potential v-Vth-α slightly smaller than the threshold of the transistor is applied from the source potential v to the gate of the transistor to select an access-targeted bit line BL and supply the source potential v to suppress the increase in current flowing in the bit line BL.

Subsequently, the impedance switching write buffer for the word line WL is described. This buffer is a circuit operative to control the impedance associated with the word line WL. It is used in suppression of a total amount of leakage current executed at the initial step for specifying a fault word line WL. Therefore, this buffer provides the word line WL with the potential $U_0$ via the high Z circuit block. It inserts the low Z circuit block at other steps. The high Z circuit block shown in FIG. 20 is also applicable in the impedance switching write buffer for the word line WL.

The above description has been given to the methods of setting the resistance state of the memory cell MC using the NT stack.

In general, for realizing mass file memories, it is important to increase the scale of the MAT to arise the share held by memory cells MC. In the case of a large scale MAT, however, it is required to transfer many pieces of data in parallel. In the case of the MAT including memory cells MC of the cross point type, plural bit lines BL are selected relative to one word line WL inevitably to make accesses to plural memory cells MC in parallel. As a result, the load of access concentrates in one word line WL as a problem. Specifically, cell currents of plural access cells MC subjected to simultaneous access superimpose one on another and flow in one word line WL. Therefore, the configuration of a large scale MAT requires increases in current capacity of a word line WL and an associated driving circuit element. As the simplest measures directed thereto, it can be considered to make the line width of the word line WL wider than the line width of the bit line BL to increase the current capacity of the word line WL. In this case, however, one of the merits of the CP cell, that is, the symmetry of vertical and horizontal widths collapses to interfere with minimization of the cell area as a problem.

Then, the following description is given to a write sequence capable of reducing the load on the access word line WL without losing the symmetry of vertical and horizontal widths of the CP cell.

In the case of a large scale MAT of the cross point type, many bits of information are accessed in the same cycle from one access word line WL to gain the transfer rate of data. Then, the embodiment uses a method of accessing memory cells MC in a resistance state with a large cell current not simultaneously but dividedly.

A transition of the resistance state with a small cell current is a transition from the low resistance state to the high resistance state. Therefore, if all access cells MC are in the high resistance state, current limiting can be applied to supply a small current, thereby increasing the number of simultaneous access cells MC per word line WL. Then, initially, the write sequence of the 2-step type becomes effective because it executes the all '0' write step of putting all access cells MC into the high resistance state. At the all '0' write step, access cells MC surely contain those in the low resistance state. At worst, it is also required to consider that all access cells MC are in the low resistance state. Then, even if all access cells MC are in the low resistance state, the number of simultaneous access cells MC is limited such that the current load on one word line WL falls within a tolerance. For making a transition of the memory cell in the low resistance state to the high resistance state, the following two points are utilized effectively in the case of the use of the NT stack. Namely, a current mode is established and a voltage applied across the memory cell MC is low, and the transition of the memory cell MC to the high resistance state sharply reduces the cell current.

Initially, the all '0' write step in the write sequence is described.

At the all '0' write step, a bit line block BBL of plural bit lines BL subjected to simultaneous access is divided into several groups GBL (hereinafter also referred to as "bit line groups" (first groups). These bit line groups GBL are accessed in a time-division manner. The bit line group GBL is configured so as to permit the load on the word line WL even if all access cells MC subjected to simultaneous access in this group are in the low resistance state. Specifically, the number of access bit lines BL subjected to simultaneous access per access word line WL is denoted with n, and the permissible number of access cells MC in the low resistance state per access word line WL seen from the current capacity of the word line WL is denoted with n/m. In this case, a bit line block BBL is divided into m bit line groups GBL and a word line WL is m-divided for access. The bit line block BBL is extended to contain extra bit lines BL by m/2 bits. This is used as a storage area of evaluation information on a majority decision executed at the following '1' write step. Namely, the bit line block BBL includes a bit line group GBL of n/m bit lines BL and a bit line group GBL of n/m+1 bit lines BL. Then, at the all '0' write step, '0' write is executed m times to n+m/2 memory cells MC repeatedly. This all '0' write step type is referred to as a "divided all '0' write step".

Figure 21:
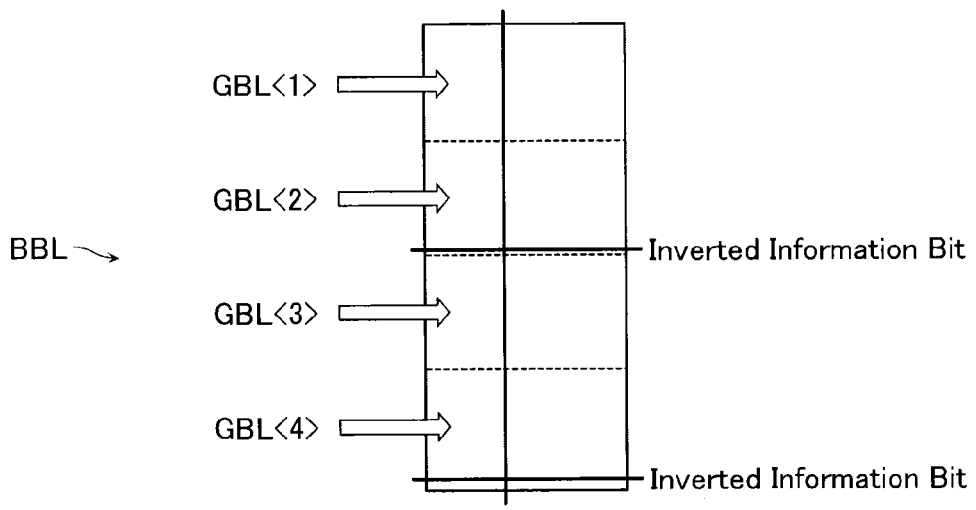
FIG. 21 is a diagram illustrative of the divided all '0' write step in the write sequence in the memory system according to the embodiment.

FIG. 21 is a diagram illustrative of the divided all '0' write step in the write sequence in the memory system according to the embodiment. In the example of FIG. 21, the bit line block BBL is divided into m=4 bit line groups GBL<1>-<4>. In this example, the bit line groups GBL<1>-<4> share a word line WL almost equally divided into quarters and each group includes successively arranged plural bit lines BL. Plural bit lines BL contained in a bit line group GBL are though not required to be successively arranged but rather may be arranged as mixed with bit lines BL contained in another bit line group GBL. This is obvious from the meaning of the divided all '0' write step.

Subsequently, the '1' write step in the write sequence is described.

At the '1' write step, a bit line block BBL is divided into m/2 bit line group pairs PGBL (second groups). At every bit line group pair PGBL, '1' write is executed to memory cells MC. The bit line group pair PGBL is a pair of a bit line group GBL of n/m bit lines BL and a bit line group GBL of n/m+1 bit lines BL. At this time, an extra bit is used to store an inverted information bit. At the '1' write step, a majority decision is made on a bit pattern of information data stored in 2n/m+1 memory cells MC subjected to simultaneous '1' write. If the number of '1' bits>the number of '0' bits, then the information data is inverted and '1' is written in the inverted information bits. In accordance with the majority decision made on the bit pattern of information data, the number of memory cells MC changed to the low resistance state can be suppressed to n/m at the maximum. Thus, it is prevented from exceeding the tolerance of the load on the word line WL. Hereinafter, the type of this '1' write step is referred to as a "divided majority decision all '0' write step". At the divided majority decision all '0' write step, the initial state of the access cell MC is the high resistance state. Therefore, a large cell current is prevented from suddenly flowing in a word line WL so that a stable write operation can be executed. In addition, the number of divided parts of a bit line block BBL is made half that at the divided all '0' write step. Therefore, the number of cycles required for write can be made smaller and the time required for data write can be reduced.

Figure 22:
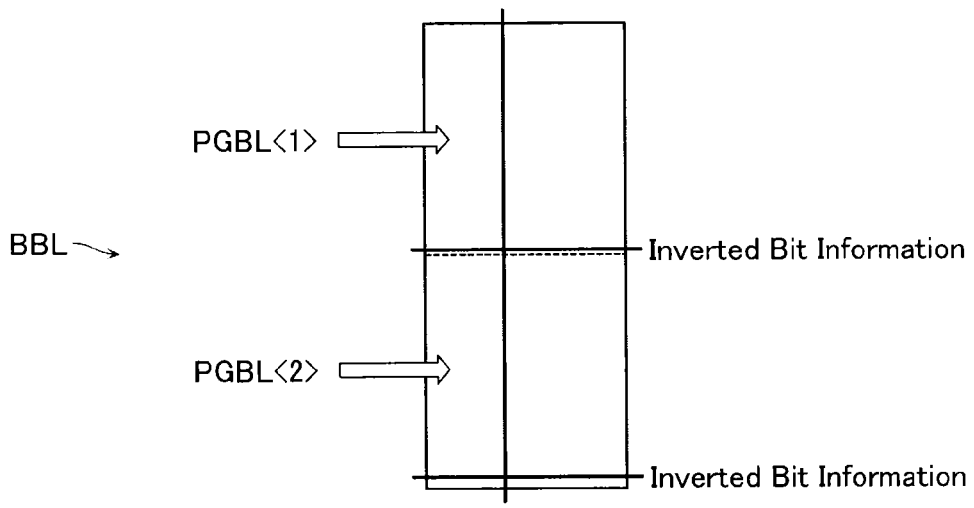
FIG. 22 is a diagram illustrative of the divided majority decision '1' write step in the write sequence in the memory system according to the embodiment.

FIG. 22 is a diagram illustrative of the divided majority decision '1' write step in the write sequence in the memory system according to the embodiment. In the example of FIG. 22, bit line groups GBL<1>-<2> configure a bit line group pair PGBL<1> and bit line groups GBL<3>-<4> configure a bit line group pair PGBL<2>. In addition, a dashed line in FIG. 22 indicates a bit line BL connected to a memory cell MC operative to store an inverted information bit.

In the case of the read sequence, it is possible to execute simultaneous read from n+m/2 memory cells MC connected to the access word line WL. At that time, if the inverted information bit is '0', then 2n/m bits of information data are read out as it is. On the other hand, if the inverted information bit is '1', then 2n/m bits of information data are inverted and then read out. In the case of the read sequence, divided read may be executed at every bit line group pair PGBL as in the divided majority decision '1' write step. As the voltage applied across each memory cell MC at the time of read operation is low, though, all memory cells MC connected to one word line WL may also be subjected to collective read.

The write sequence of the 2-step type described above is predicted on a memory system that includes memory cells MC using NT stacks characterized in unipolar operation. In unipolar operation, a large current arises as a problem while the memory cell MC changes the resistance state. Therefore, the above-described write sequence uses the divided all '0' write sequence to reduce the current load on the word line WL.

In this connection, when memory cells MC capable of bipolar operation, such as ion memories, are used, the above write step is also applicable. The bipolar operation is operation of a memory cell MC that makes a transition to the low resistance state on application of a voltage of a positive polarity and a transition to the high resistance state on application of a voltage of a negative polarity, for example, as is said. Then, the following description is given to the write sequence of the 2-step type applicable to a memory system using memory cells MC capable of bipolar operation. Also in this case, the number of access bit lines BL subjected to simultaneous access per access word line WL is denoted with n, and the permissible number of access cells MC in the low resistance state per access word line WL seen from the current capacity of the word line WL is denoted with n/m.

Memory cells MC capable of bipolar operation include a memory cell MC such as an ion memory that forms a conductive filament in a medium to change the resistance state. In the case of bipolar operation, if the resistance state is changed to the high resistance state when the memory cell MC is reverse-biased, the write sequence can be made somewhat simpler than that in the case of unipolar operation. Further, also in the write sequence, the resistance states of all access cells MC are once changed to the high resistance state as in the case of unipolar operation.

Initially, the all '0' write step in the write sequence is described.

The all '0' write step is a step of changing the resistance state to the high resistance state. If an ion memory is used as a memory cell MC, it is a step of applying a reverse bias across the memory cell MC. Therefore, at this step, cell current in the memory cell MC is extremely small. Then, in the case of bipolar operation, a bit line block BBL is not divided and all memory cells MC connected to the bit line block BBL are collectively subjected to '0' write. Hereinafter, this all '0' write step is referred to as a "collective all '0' write step". At the collective all '0' write step, '0' write is also executed to inverted information bits.

Figure 23:
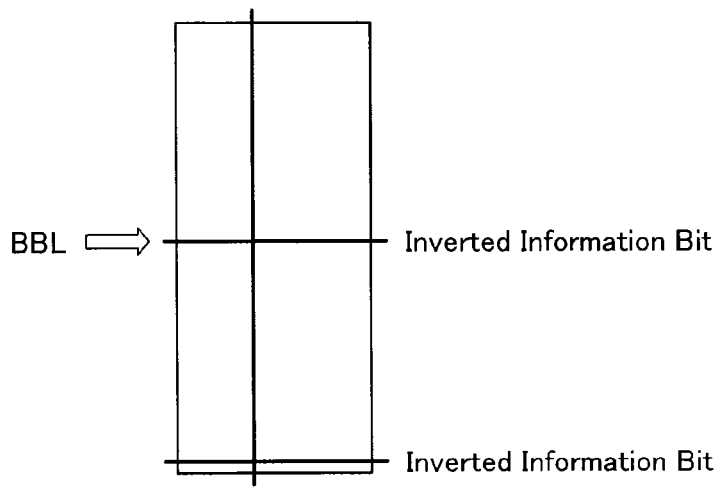
FIG. 23 is a diagram illustrative of the collective all '0' write step in the write sequence in the memory system according to the embodiment.

FIG. 23 is a diagram illustrative of the collective all '0' write step in the write sequence in the memory system according to the embodiment. In the example of FIG. 23, the bit line block BBL is not divided and n+m/2 memory cells MC are simultaneously subjected to '0' write.

Subsequently, the '1' write step in the write sequence is described.

At the '1' write step, the divided majority decision '1' write step is executed as in the case of unipolar operation. The method of dividing a bit line block BBL is similar to that in the case of unipolar operation. The bit line block BBL is divided into a bit line group GBL of n/m bit lines BL and a bit line group GBL of n/m+1 bit lines BL, which are paired in a bit line group pair PGBL. Then, when 2n/m+1 memory cells MC in the bit line group pair PGBL are subjected to simultaneous '1' write, inverted information bits are also written as in the case of unipolar operation. Also in the case of bipolar operation, '1' write is executed by applying a forward bias across memory cells MC as in the case of unipolar operation. Accordingly, in the second half of '1' write, a large cell current may possibly flow in memory cells MC. Therefore, also in the case of bipolar operation, it is required to consider the tolerance of the load on the word line WL as in unipolar operation.

As described above, the divided majority decision '1' write step in the case of bipolar operation is similar to that in the case of unipolar operation and accordingly the situation with regard to '1' write is similar to that in FIG. 22. In addition, the read sequence is also similar to that in the case of unipolar operation.

In the write sequence, a majority decision is executed on a bit pattern of information data. The following description is given to a majority decision logic circuit for use therein.

Figure 24:
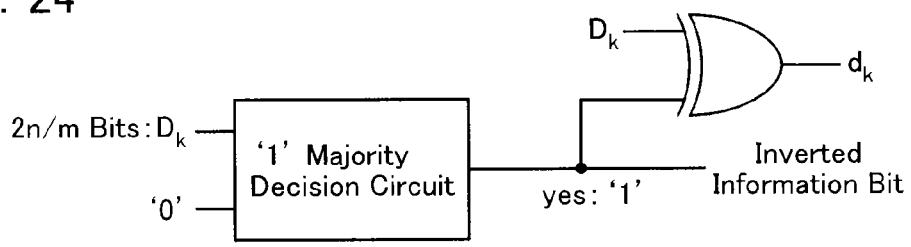
FIG. 24 is a diagram showing a majority decision logic circuit for use in the write sequence in the memory system according to the embodiment.

FIG. 24 is a diagram showing the majority decision logic circuit for use in the write sequence in the memory system according to the embodiment.

A majority decision in the write sequence is executed for '1' majority decision on the basis of the input of a bit pattern composed of 2n/m bits of information data Dk and one bit of fixed data '0'. A circuit block for executing this majority decision is a '1' majority decision circuit shown in FIG. 24. The '1' majority decision circuit provides '1' if '1's occupy the majority in the bit pattern. The number of bits in the bit pattern is odd and accordingly a majority decision can surely establish. The majority decision logic circuit used in the write sequence operates Exclusive OR of the output from the '1' majority decision circuit and each bit of information data Dk to generate information data dk actually written in a memory cell MC. The output from the '1' majority decision circuit is overwritten on the inverted information bit for storing a fixed bit '0'.

Figure 25:
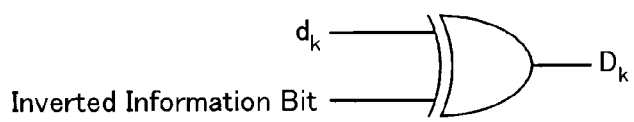
FIG. 25 is a diagram showing a majority decision logic circuit for use in a read sequence in the memory system according to the embodiment.

FIG. 25 is a diagram showing a majority decision logic circuit for use in the read sequence in the memory system according to the embodiment.

In the read sequence, Exclusive OR of an inverted information bit and each bit of information data dk is operated to restore each bit of information data Dk.

The following supplementary description is given to the read sequence.

In the write sequence, for reducing the load on the access word line WL, write is executed on the bit line group GBL basis or on the bit line group pair PGBL basis. Also in the read sequence, the load on the access word line WL is relatively heavy. Therefore, cell current varies greatly depending on the location of the word line WL. In particular, a fine memory cell MC with a small cell current largely suffers this influence. A cell current referred to at the time of read (hereinafter referred to as "reference cell current") flows in a bit line BL (hereinafter referred to as a "reference bit line"). Such the bit line can be provided in the environment associated with word lines WL similar to that for normal bit lines BL, thereby realizing an optimal method of detecting cell current at the time of read. A way to provide the reference bit line utilizes the bit line group pair PGBL used in the '1' write step at the time of write, thereby arranging groups of memory cells MC having the same write condition into a bit line group pair PGBL (third group). As a result, a memory cell MC for generating the reference cell current (hereinafter referred to as a "reference cell") having the same read condition as that for normal memory cells MC can be provided in the bit line group pair PGBL. Plural reference cells connected to the reference bit line are used to store '1' regardless of information data. In a word, the reference cells are kept in the low resistance state. When the reference cells are kept in the low resistance state, large cell current flows. If the cell current can be made smaller at a certain ratio, it is possible to generate the reference cell current. Desirably, the reference bit line is arranged physically at the central position as close as possible in the bit line group pair PGBL. This makes it possible to obtain the reference cell current matched with the environment for each bit line group pair PGBL at the time of read.

Figure 26:
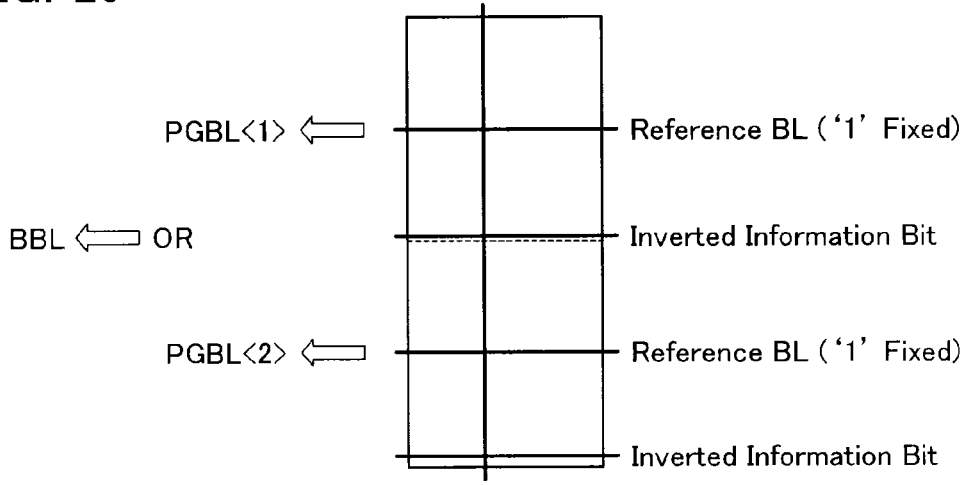
FIG. 26 is a diagram illustrative of the read sequence in the memory system according to the embodiment.

FIG. 26 is a diagram illustrative of the read sequence in the memory system according to the embodiment.

In the case of FIG. 26, a bit line block BBL is divided into two bit line group pairs PGBL<1>-<2> as in the case of the write sequence. Each bit line group pair PGBL includes, physically at the central position, a reference bit line BL connected to a reference cell RC for storing fixed data '1'. If it is desired in the read sequence to reduce the load on the word line WL to gain a margin of current capacity of the word line WL, it is sufficient to execute read in a time-division manner on the bit line group pair PGBL basis as in the case of the divided majority decision '1' write step. On the other, if it is desired to process the read sequence faster, the bit line block BBL may be subjected to collective data read. Even in this case, the voltage/current required for read operation is considerably small. Accordingly, depending on the scale of the bit line block BBL, the load on the word line WL can fall within a tolerance. In any case, the reference bit line is used at every bit line group pair PGBL to decide the cell current in the access cell MC so as to execute a majority decision on information data and arithmetic processing of an ECC and so forth.

Up to this point, the access procedure for one MAT has been described. In practice, however, the true value of CP cells can be exhibited when a three-dimensionally structured cell array is constructed. Then, the following description is given to a configuration of a three-dimensionally structured cell array and data bus capable of utilizing the access procedure for one MAT.

When a mass memory is manufactured using a cell array including plural stacked MATs, the cell share of a chip suffers influences most from selection line drivers arranged around the MAT.

When transistor circuits are formed on a semiconductor substrate, the circuit scale increases almost in proportion to the number of stacked MATS. In a word, the more the MATs stacked, the more the drivers expand increasingly. In a word, an increase in cell share requires each MAT to be large-scaled and the increase in two-dimensional area of the associated peripheral circuits to be made as small as possible. When the MAT is large-scaled, however, a problem associated with fault cells and a problem associated with a load on the word line WL remarkably appear to that extent. Then, drivers are provided within a MAT even though the MAT becomes somewhat large. This is effective in increasing the cell share and becomes an important technology of constructing a three-dimensionally structured cell array using CP cells. In this case, the transistors contained in drivers are thin film transistors, that is, TFTs. As for TFTs, it can be considered to divert the technologies of oxide semiconductors utilized in displays and so forth and known as having extreme performances.

TFTs can be connected directly to the ends of selection lines in each MAT to control access to the MAT via no vertical lines connected to the semiconductor substrate, thereby stacking transistors required at every MAT. Therefore, the peripheral circuit can be constructed in the same area as that in the case of a cell array that is substantially composed of one MAT and structured in a single layer. Thus, it is made possible to substantially eliminate the problem associated with the drop of the cell share in accordance with the increase in the number of stacked MATs.

Figure 27:
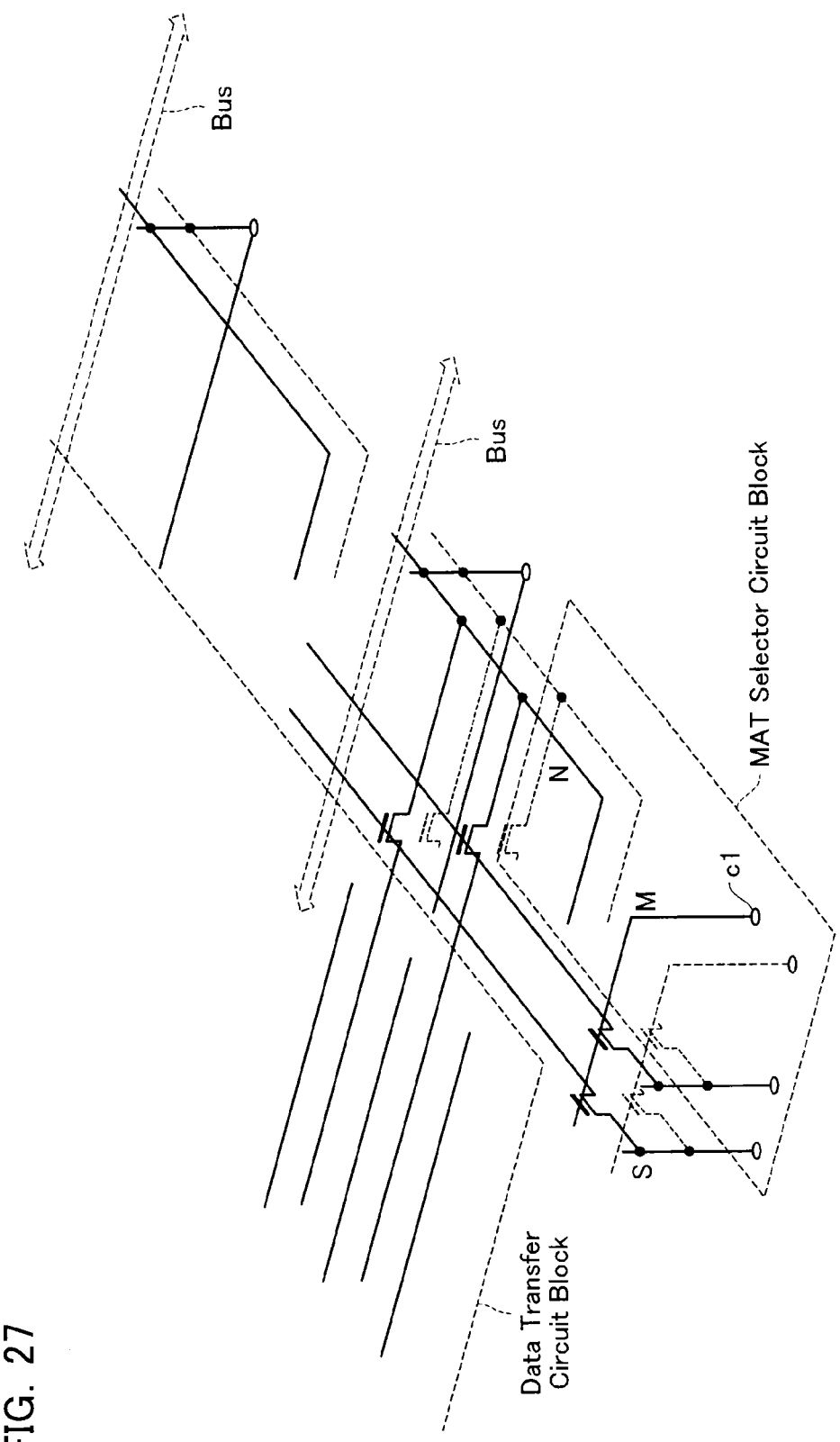
FIG. 27 is a perspective view showing a brief configuration of part of MATs and peripheral circuits thereof in the memory system according to the embodiment.
Figure 28:
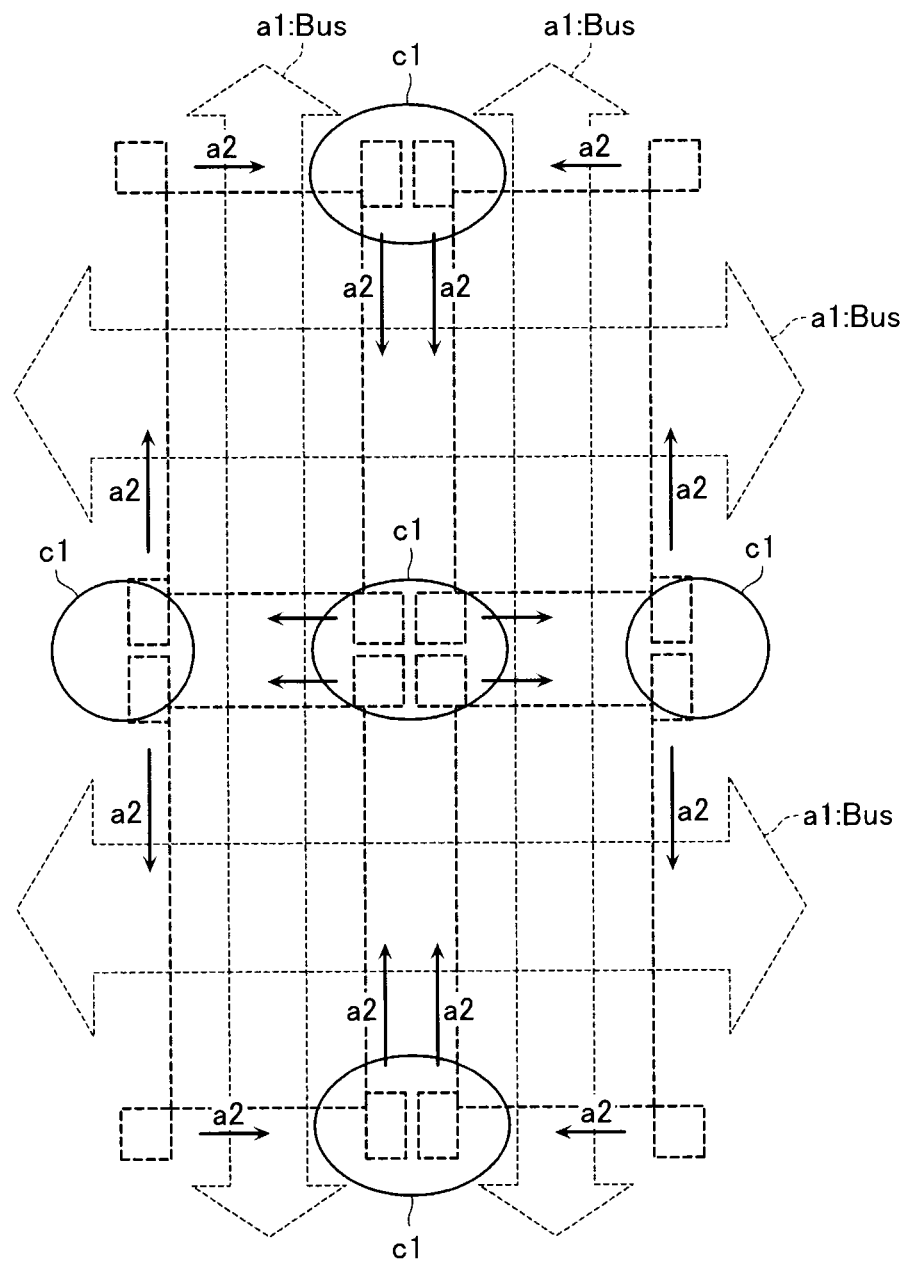
FIG. 28 is a plan view showing a brief configuration of part of MATs and peripheral circuits thereof in the memory system according to the embodiment.

FIGS. 27 and 28 are diagrams showing a brief configuration of part of MATs and peripheral circuits thereof in the memory system according to the embodiment. FIG. 27 is a perspective view and FIG. 28 is a plan view. FIGS. 27 and 28 use dashed lines to show circuit blocks and bus lines on the semiconductor substrate. Circles c1 in FIG. 27 indicate connection portions to circuit lines on the semiconductor substrate. In addition, the specific circuitry in the circuit block is omitted.

The circuit blocks on the semiconductor substrate are roughly divided into two. The first is a data transfer circuit block and the second is a MAT selector circuit block. The data transfer circuit block is a circuit group that occupies the part beneath the stacked MATs and executes selection line decoding and data processing. In addition, the MAT selector circuit block is operative to select among MATs and make access thereto. The data transfer circuit block is a circuit associated with writing data to memory cells MC and reading data from memory cells MC. It includes control logic circuits such as a sense amp SA and a roughest selection line decoder. The MAT selector circuit block is a part for determining which MAT of the stacked MATs should be under action of the data transfer circuit block. The MAT selector circuit block passes signals therethrough to the selected MAT and brings other non-selected MATs into the floating state. The MAT selector circuit block is arranged at a location, around the corner of a MAT, closest to each MAT and having an extreme symmetry.

As each MAT is integrated with the later-described selection line drivers, different from the case where these selection transistors are provided on the surface of the semiconductor substrate, vertical lines to the semiconductor substrate can be reduced. Therefore, for the convenience of the data transfer circuit block located immediately beneath the stacked MATs, data and control signal buses can be arranged almost freely. In FIG. 28, the directions of data signal buses are denoted with the arrows a1 and the directions of signals associated with the MAT selector circuit block are denoted with the arrows a2.

Circuit blocks taking actions of the same kind on the MATs can be collected to achieve an effective layout. For example, a collection of MAT selector circuit blocks shown by the circle c1 in FIG. 28 corresponds thereto.

A configuration of selection line drivers on each MAT is described with reference to FIG. 27.

As shown in FIG. 27, selection lines on each MAT are driven, for example, from one side and the opposite side of the MAT alternately at every line. In a word, when a certain selection line is driven from one side of the MAT, a selection line adjacent to that selection line is driven from the opposite side. In addition to the case shown in FIG. 27, the selection lines may be driven from one side of the MAT and the opposite side at every certain collection. In the case shown in FIG. 27, selection lines aligned on alternate lines include several adjacent selection lines that are collected in a selection line group. The selection line group is provided with a common node N. The node N serves as a common node for plural stacked MATs. The node N is selectively connected to each selection line via TFT switches. It is a TFT decoder arranged around the corner of the MAT that supplies a gate signal to the TFT to control it. For decoding, these decoders use a signal common to MATs, that is, a signal S for determining a selection line to be selected in a MAT, and a signal M for selecting a MAT to which the signal S is sent. The signal M is turned to the gate signal of the TFT in each MAT and sent to the MAT that selects the signal S.

The node N and the signal lines of signals S and M are contained in the vertical lines and connected to the circuit blocks on the semiconductor substrate. The vertical lines extending from the MAT may be provided one at every selection line group and accordingly the number thereof can be made half or lower than a total number of selection lines in the MAT. In a word, compared to the structure including vertical lines provided by the same number as that of selection lines, the density of lines in a peripheral area of the MAT can be made smaller, thereby improving the flexibility of the layout of the bus and so forth as described above.

The following description is given to methods of stacking memory cells MC.

Figure 29:
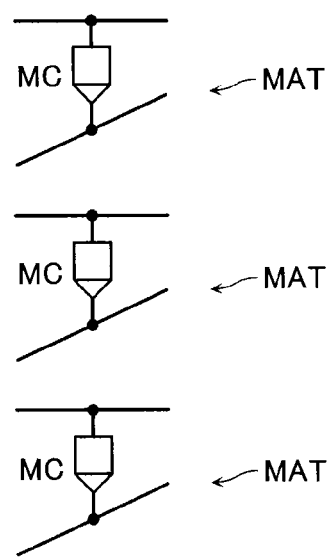
FIG. 29 is a diagram showing a method of stacking memory cells in the memory system according to the embodiment.
Figure 30:
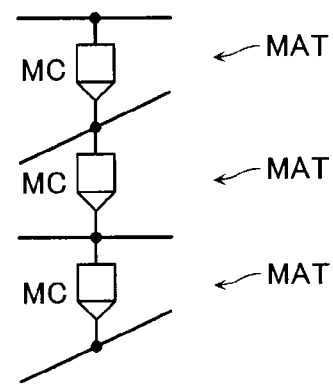
FIG. 30 is a diagram showing a method of stacking memory cells in the memory system according to the embodiment.
Figure 31:
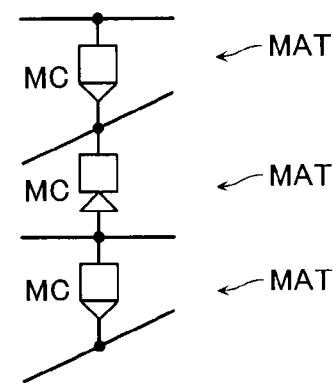
FIG. 31 is a diagram showing a method of stacking memory cells in the memory system according to the embodiment.

FIGS. 29-31 are diagrams showing methods of stacking memory cells in the memory system according to the embodiment. The methods of stacking memory cells are roughly divided into three, including individual stacking, forward stacking and reverse stacking.

Initially, individual stacking shown in FIG. 29 is described.

Individual stacking is a method of stacking memory cells MC applied to a cell array including similarly structured MATs repeatedly stacked with insulation layers sandwiched therebetween. In the case of the cell array thus structured, no time and effort is required for process integration, and the study on a single MAT can be utilized as the study on the entire cell array as it is. Therefore, the design is easy. On the other hand, selection lines and so forth cannot be shared with adjacent MATs at all. Accordingly, the production costs increase.

Subsequently, forward stacking shown in FIG. 30 is described.

Forward stacking is a method of stacking memory cells MC applied to a cell array including selection lines shared between adjacent MATs. The directions of anodes and cathodes of memory cells MC are the same in all cell arrays. In the case of the cell array thus structured, the production costs can be reduced considerably, and the process integration is close to the study on a single MAT. The design is difficult, however. In particular, bit lines BL and word lines WL have different roles depending on the MAT. Therefore, the design and layout of selection line drivers are extremely difficult.

Finally, reverse stacking shown in FIG. 31 is described.

Reverse stacking is a method of stacking memory cells MC applied to a cell array including selection lines shared between adjacent MATs. The directions of anodes and cathodes of memory cells MC are reversed between adjacent MATs. In the case of the cell array thus structured, it is not required to change the roles of bit lines BL and word lines WL at every MAT as in forward stacking. Accordingly, it can be realized by the system design almost similar to that of individual stacking. It is, however, required to sufficiently study the interference between MATs. In addition, the production costs can be considerably reduced as in the case of forward stacking. The polarities of memory cells MC, however, change between adjacent MATs. Thus, process integration is complicated. Preferably, the inversion of the polarities of memory cells MC may be supported not by reversing the process of stacking the entire memory cells MC as it is but by reversing only the process of stacking diodes as shown in FIG. 31. If the process of stacking the entire memory cells MC is inverted, the thermal process for memory cells MC varies at every MAT.

The above-described embodiment makes it possible to provide a low power consuming, fault-resistant memory system suitable for mass file memories.

[Others]

While the embodiments of the present invention have been described, these embodiments are presented by way of example and are not intended to limit the scope of the invention. These novel embodiments can be implemented in a variety of other forms, and various omissions, substitutions and changes can be made without departing from the spirit of the invention. These embodiments and variations thereof would fall within the scope and spirit of the invention and also fall within the invention recited in claims and equivalents thereof.

What is claimed is:

1. A memory system, comprising:
  a cell array including a unit cell array, said unit cell array containing plural first lines, plural second lines intersecting said plural first lines, and plural memory cells provided at the intersections of said plural first lines and said plural second lines and operative to store data in accordance with different resistance states; and
  an access circuit operative to execute a write sequence of changing said resistance state for writing data in said memory cell,
  wherein said memory cell has two resistance states including a low resistance state and a high resistance state at least,
  an access-targeted memory cell is defined as an access cell, a first line connected to said access cell as an access first line, a second line connected to said access cell as an access second line, a fault-caused memory cell as a fault cell, and a second line connected to said fault cell as a fault second line,
  said access circuit, on said write sequence, executes
  a first step of changing all memory cells provided at the intersections of access first lines and said access and fault second lines to said high resistance state, and a second step of changing all or part of access cells connected to said access second line to said low resistance state, and said access circuit, on said write sequence, once changes said access cell which is changed to said low resistance state on said second step to said high resistance state on said first step.

2. The memory system according to claim 1, wherein said memory cell changes to said low resistance state on application of a certain voltage and to said high resistance state by the passage of a certain current.

3. The memory system according to claim 1, wherein said memory cell includes a nanotube stack of stacked nanotubes.

4. The memory system according to claim 3, wherein said memory cell includes a diode stacked on said nanotube stack.

5. The memory system according to claim 1, wherein said memory cell changes to said low resistance state on application of a voltage of a first polarity and to said high resistance state on application of a voltage of a second polarity different from said first polarity.

6. The memory system according to claim 1, wherein said access circuit includes an impedance switching write buffer operative to switch the impedance between a power supply and said plural second lines.

7. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of changing all memory cells provided at the intersections of access first lines and said access and fault second lines to said high resistance state, and
a second step of changing all or part of access cells connected to said access second line to said low resistance state, and
said access circuit, at said first step in said write sequence of writing data in plural memory cells provided at the intersections of plural first lines and one second line, divides said plural first lines into plural first groups containing a certain number of first lines, and changes all said memory cells provided at the intersections of said certain number of first lines and said one second line to said high resistance state in a time-division manner on said first group basis.

8. The memory system according to claim 7,
wherein said access circuit, at said second step in said write sequence of writing data in plural memory cells provided at the intersections of plural first lines and one second line, integrates two first groups into a second group, and changes part of said memory cells provided at the intersections of first lines in said second group and one first line to said low resistance state in a time-division manner on said second group basis, and said memory cells are provided at the intersections of first lines in said second group and one second line such that the number of memory cells changed to said low resistance state at said second step is smaller than the number of memory cells maintained in said high resistance state at said second step.

9. The memory system according to claim 8, wherein said second groups each includes a first line connected to a memory cell for storing the result of a majority decision on said resistance states of memory cells provided at the intersections of plural first lines in said second group and one second line.

10. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of changing all memory cells provided at the intersections of access first lines and said access and fault second lines to said high resistance state, and
a second step of changing all or part of access cells connected to said access second line to said low resistance state, and
said access circuit, on said write sequence, executes a third step of detecting said fault second line of said plural second lines before said first step.

11. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of changing all memory cells provided at the intersections of access first lines and said access and fault second lines to said high resistance state, and a second step of changing all or part of access cells connected to said access second line to said low resistance state, and said access circuit, on said write sequence, executes a further step of bringing said plural first lines and said plural second lines into the floating state after said second step.

12. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of changing all memory cells provided at the intersections of access first lines and said access and fault second lines to said high resistance state, and
a second step of changing all or part of access cells connected to said access second line to said low resistance state,
said access circuit executes a read sequence of reading data from said memory cell by detecting said resistance state, and
said access circuit, on said read sequence of reading data from memory cells provided at the intersections of plural first lines and one second line, divides said plural first lines into plural third groups containing a certain number of first lines, and reads data from said memory cells provided at the intersections of said certain number of first lines and said one second line in a time-division manner on said third group basis.

13. The memory system according to claim 12, wherein said third groups each include a first line, which is connected to a reference cell located physically substantially on the central position in said third group and operative to store a data deciding criterion on said read sequence.

14. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of setting said access first line on a first potential and setting said access and fault second lines on a second potential lower than said first potential, and
a second step of maintaining said access second line on said first potential to supply a current in all or part of said access first line, and
said access circuit, on said write sequence, once changes said access cell which is changed to said low resistance state on said second step to said high resistance state on said first step.

15. The memory system according to claim 14, wherein said memory cell changes to said low resistance state on application of a certain voltage and to said high resistance state by the passage of a certain current.

16. The memory system according to claim 14, wherein said memory cell includes a nanotube stack of stacked nanotubes.

17. The memory system according to claim 16, wherein said memory cell includes a diode stacked on said nanotube stack.

18. The memory system according to claim 14, wherein said memory cell changes to said low resistance state on application of a voltage of a first polarity and to said high resistance state on application of a voltage of a second polarity different from said first polarity.

19. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and
an access circuit operative to execute a write sequence of changing said resistance state for writing data in said memory cell,
wherein said memory cell has two resistance states including a low resistance state and a high resistance state at least,
an access-targeted memory cell is defined as an access cell, a first line connected to said access cell as an access first line, a second line connected to said access cell as an access second line, a fault-caused memory cell as a fault cell, and a second line connected to said fault cell as a fault second line,
said access circuit, on said write sequence, executes
a first step of setting said access first line on a first potential and setting said access and fault second lines on a second potential lower than said first potential, and
a second step of maintaining said access second line on said first potential to supply a current in all or part of said access first line, and
said access circuit, on said write sequence, executes a third step of detecting said fault second line of said plural second lines before said first step.

20. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different resistance states; and an access circuit operative to execute a write sequence of changing said resistance state for writing data in said memory cell, wherein said memory cell has two resistance states including a low resistance state and a high resistance state at least, an access-targeted memory cell is defined as an access cell, a first line connected to said access cell as an access first line, a second line connected to said access cell as an access second line, a fault-caused memory cell as a fault cell, and a second line connected to said fault cell as a fault second line, said access circuit, on said write sequence, executes a first step of setting said access first line on a first potential and setting said access and fault second lines on a second potential lower than said first potential, and a second step of maintaining said access second line on said first potential to supply a current in all or part of said access first line, and said access circuit, on said write sequence, executes a further step of bringing said plural first lines and said plural second lines into the floating state after said second step.

* * * * *